(12) United States Patent
Utsumi

(10) Patent No.: US 10,950,441 B1
(45) Date of Patent: Mar. 16, 2021

(54) LOW ENERGY E-BEAM CONTACT PRINTING LITHOGRAPHY

(71) Applicant: Takao Utsumi, Tokyo (JP)

(72) Inventor: Takao Utsumi, Tokyo (JP)

(73) Assignees: Kyoka Utsumi Mimura, Tokyo (JP); Shigeru Utsumi, Kanagawa-Ken (JP); Takashi Utsumi, Yokohama (JP)

( * ) Notice: Subject to any disclaimer, the term of this patent is extended or adjusted under 35 U.S.C. 154(b) by 0 days.

(21) Appl. No.: 16/811,339

(22) Filed: Mar. 6, 2020

Related U.S. Application Data

(63) Continuation-in-part of application No. 16/558,657, filed on Sep. 3, 2019.

(51) Int. Cl.
| | | |
|---|---|---|
| *H01L 21/027* | (2006.01) | |
| *H01L 21/033* | (2006.01) | |
| *H01L 21/683* | (2006.01) | |
| *H01L 21/308* | (2006.01) | |

(52) U.S. Cl.
CPC ...... *H01L 21/0274* (2013.01); *H01L 21/0332* (2013.01); *H01L 21/6835* (2013.01); *H01L 21/3086* (2013.01)

(58) Field of Classification Search
CPC ............. H01L 21/0274; H01L 21/0332; H01L 21/6835; H01L 21/3086
See application file for complete search history.

(56) References Cited

U.S. PATENT DOCUMENTS

| | | | | |
|---|---|---|---|---|
| 2002/0130425 A1* | 9/2002 | Koike | ................ | G03F 1/20 257/797 |
| 2005/0105093 A1* | 5/2005 | Tokita | ................ | G03F 9/7034 356/401 |
| 2005/0170265 A1* | 8/2005 | Moriya | ................ | G03F 1/50 430/5 |
| 2007/0009671 A1* | 1/2007 | Manz | ................ | C23C 14/042 427/468 |
| 2009/0147228 A1* | 6/2009 | Ono | ................ | G03F 7/70833 355/53 |
| 2011/0083887 A1* | 4/2011 | Brock | ................ | H01L 23/5329 174/258 |
| 2017/0250379 A1* | 8/2017 | Verplancken | ......... | C23C 14/042 |
| 2019/0368024 A1* | 12/2019 | Heymanns | ............ | C23C 14/568 |
| 2020/0083452 A1* | 3/2020 | Heymanns | .......... | H01L 51/0012 |

FOREIGN PATENT DOCUMENTS

| | | | | |
|---|---|---|---|---|
| JP | 2006176809 A | * | 7/2006 | |
| WO | 2018-153481 | * | 8/2018 | |

\* cited by examiner

*Primary Examiner* — David H Banh
(74) *Attorney, Agent, or Firm* — Fox Rothschild LLP; Robert J. Sacco

(57) ABSTRACT

A method comprising contact-free positioning a template mask wafer having a template device pattern relative to a predetermined surface area section of a device pattern wafer. The template mask wafer includes a semitransparent layer. The method includes contact-free aligning one or more mask alignment marks of the template mask wafer with one or more alignment marks of the device pattern wafer and contacting the mask wafer on the device pattern wafer. The method includes transferring a template device pattern of the template mask wafer onto the predetermined surface area section of the device pattern wafer using an electron beam while heat conduction is distributed throughout the mask wafer to maintain a low temperature rise in the mask wafer during the transferring. A system is also provided.

36 Claims, 22 Drawing Sheets

LOW ENERGY E-BEAM CONTACT PRINTING LITHOGRAPHY

CROSS-REFERENCE TO RELATED APPLICATIONS

This application is a continuation-in-part of U.S. patent application Ser. No. 16/558,657, titled "LOW ENERGY E-BEAM CONTACT PRINTING LITHOGRAPHY," filed Sep. 3, 2019, to the same inventor and incorporated herein by reference as if set forth in full below.

BACKGROUND

The disclosure herein relates generally to semiconductor lithography, and more particularly, to low energy electron-beam (e-beam) contact printing lithography.

Conventional e-beam projection lithography, such as low energy e-beam projection lithography (LEEPL), may use stencil masks that have holes to form a device pattern during an exposure process. Typically, a number of complementary stencil masks may be required to write more complex patterns, such as donut-shaped patterns. For instance, if only one mask were used to write donut-shaped patterns, the mask would not be able to include the circular center of the donut-shaped pattern, as the circular center of the donut-shaped pattern would not be supported by the main portion of the mask. However, using more than one mask may increase the time to form device patterns in a semiconductor wafer, and exposing the layers multiple times may reduce the throughput of the system on various layers. Additionally, another process is required to align the extra masks, thereby increasing the complexity of forming the semiconductor. In conventional e-beam lithography, a large gap, e.g., about 10 micrometers to about 40 micrometers, is typically formed between the resist layer and the mask layer. During the e-beam projection process, the electron optics, such as space charge and lens aberration, of the LEEPL system create a beam blur within the large gap, thereby deteriorating the resolution of the LEEPL system. Moreover, in conventional e-beam lithography, the resist layer and the mask layer are floating in a vacuum during the writing process. Consequently, heat conduction may only occur through a peripheral portion of the mask layer. That is, if the power of the e-beam increases, the LEEPL system may not be able to maintain a low temperature rise and thus a low thermal distortion. As the temperature rise and thermal distortion of the mask layer limit the e-beam current, the throughput of the conventional LEEPL system may be limited.

SUMMARY

The summary of the disclosure is given to aid understanding of semiconductor structures, processes, and methods of low energy e-beam contact printing lithography (LEECOPL), and not with an intent to limit the disclosure. The disclosure is directed to a person of ordinary skill in the art. It should be understood that various aspects and features of the disclosure may advantageously be used separately in some instances, or in combination with other aspects and features of the disclosure in other instances.

Accordingly, variations and modifications may be made to semiconductor structures, processes, and methods of LEECOPL to achieve different effects. It is to be understood that both the foregoing general description and the following detailed description are exemplary and explanatory only and are not restrictive of the broad inventive concepts upon which the embodiments disclosed herein are based.

In one or more cases, the disclosed technology relates to a method of contact printing. In one or more cases, the method includes contact-free positioning a template mask wafer having a template device pattern relative to a predetermined surface area section of a device pattern wafer. In one or more cases, the template mask wafer includes a semitransparent layer. In one or more cases, the method includes contact-free aligning one or more mask alignment marks of the template mask wafer with one or more alignment marks of the device pattern wafer and contacting the mask wafer on the device pattern wafer. In one or more cases, the method includes transferring a template device pattern of the template mask wafer onto the predetermined surface area section of the device pattern wafer using an electron beam while heat conduction is distributed throughout the mask wafer to maintain a low temperature rise in the mask wafer during the transferring.

In one or more cases, the disclosed technology relates to a tangible, non-transitory computer readable medium for causing transferring one or more device patterns of a template mask wafer onto a device pattern wafer. In one or more cases, the tangible, non-transitory computer readable medium has stored thereon programming instructions which when executed causes one or more processor to cause contact-free positioning of a template mask wafer having a template device pattern relative to a predetermined surface area section of a device pattern wafer. In one or more cases, the template mask wafer including a semitransparent layer. In one or more cases, the tangible, non-transitory computer readable medium has stored thereon programming instructions which when executed causes one or more processor to cause contact-free aligning of one or more mask alignment marks of the template mask wafer with one or more alignment marks of the device pattern wafer. In one or more cases, the tangible, non-transitory computer readable medium has stored thereon programming instructions which when executed causes one or more processor to cause contacting of the mask wafer with the device pattern wafer. In one or more cases, the tangible, non-transitory computer readable medium has stored thereon programming instructions which when executed causes one or more processor to cause transferring of a template device pattern of the template mask wafer onto the predetermined surface area section of the device pattern wafer using an electron beam while heat conduction is distributed throughout the mask wafer to maintain a low temperature rise in the mask wafer.

The foregoing and other objects, features and advantages of the disclosure will be apparent from the following descriptions of the embodiments and as illustrated in the accompanying drawings.

BRIEF DESCRIPTION OF THE DRAWINGS

The following drawings are illustrative of particular embodiments of the disclosure and therefore do not limit the scope of the disclosure. The drawings are not to scale and are intended for use in conjunction with the explanations in the following detailed description. It may be noted that a numbered element is numbered according to the figure in which the element is introduced, and is typically referred to by that number throughout succeeding figures.

The various aspects, features and embodiments of low energy e-beam contact printing lithography (LEECOPL) will be better understood when read in conjunction with the figures provided. Embodiments are provided in the figures for the purpose of illustrating aspects, features, and/or various embodiments of LEECOPL, but the claims should not be limited to the precise arrangement, structures, features, aspects, assemblies, systems, embodiments, or devices shown. The arrangements, structures, subassemblies, features, aspects, methods, processes, embodiments, and devices shown may be used singularly or in combination with other arrangements, structures, assemblies, subassemblies, systems, features, aspects, embodiments, methods and devices.

DETAILED DESCRIPTION

Figure 1:
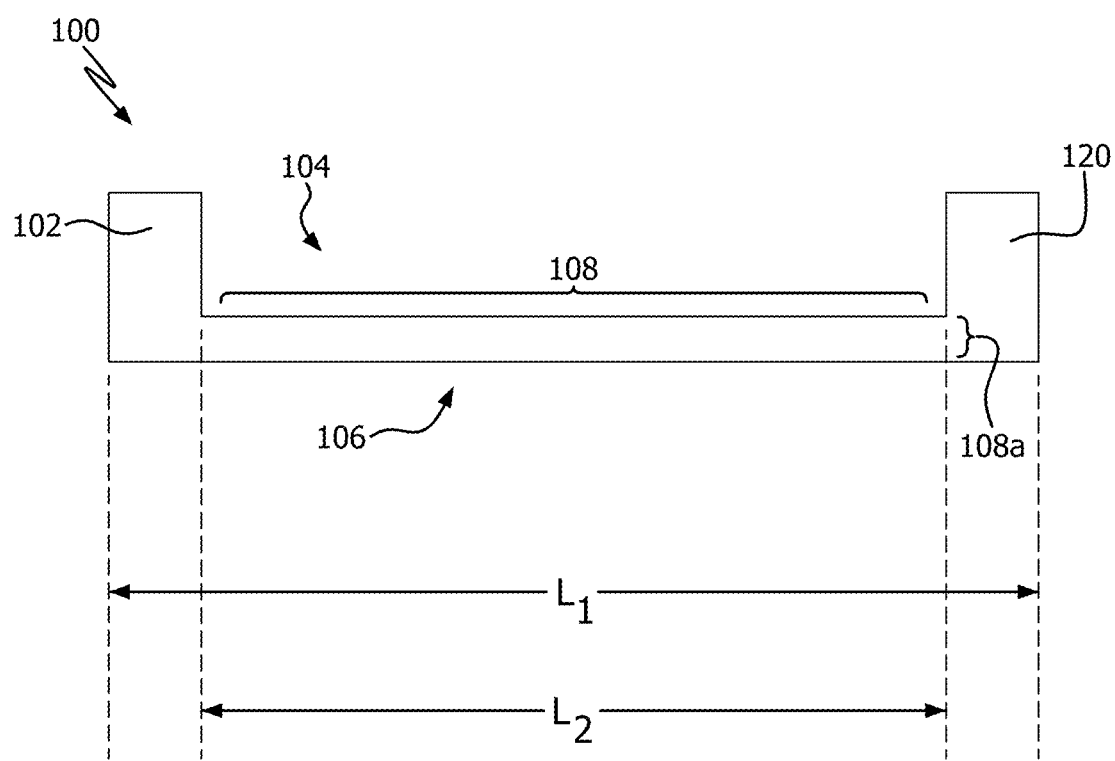
FIG. 1 illustrates a side view of a membrane formed in a substrate layer.

The following discussion omits or only briefly describes conventional features of semiconductor lithography, which are apparent to those skilled in the art. It is noted that various embodiments are described in detail with reference to the drawings, in which like reference numerals represent like parts and assemblies throughout the several views. Reference to various embodiments does not limit the scope of the claims attached hereto. Additionally, any examples set forth in this specification are intended to be non-limiting and merely set forth some of the many possible embodiments for the appended claims. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an" and "the" include plural referents unless otherwise specified, and that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the embodiments.

In the interest of not obscuring the presentation of embodiments in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments described herein.

Embodiments of the disclosure relate generally to semiconductor lithography, and more particularly, to low energy e-beam contact printing lithography (LEECOPL). Embodiments of LEECOPL are described further below with reference to the Figures.

Figure 2:
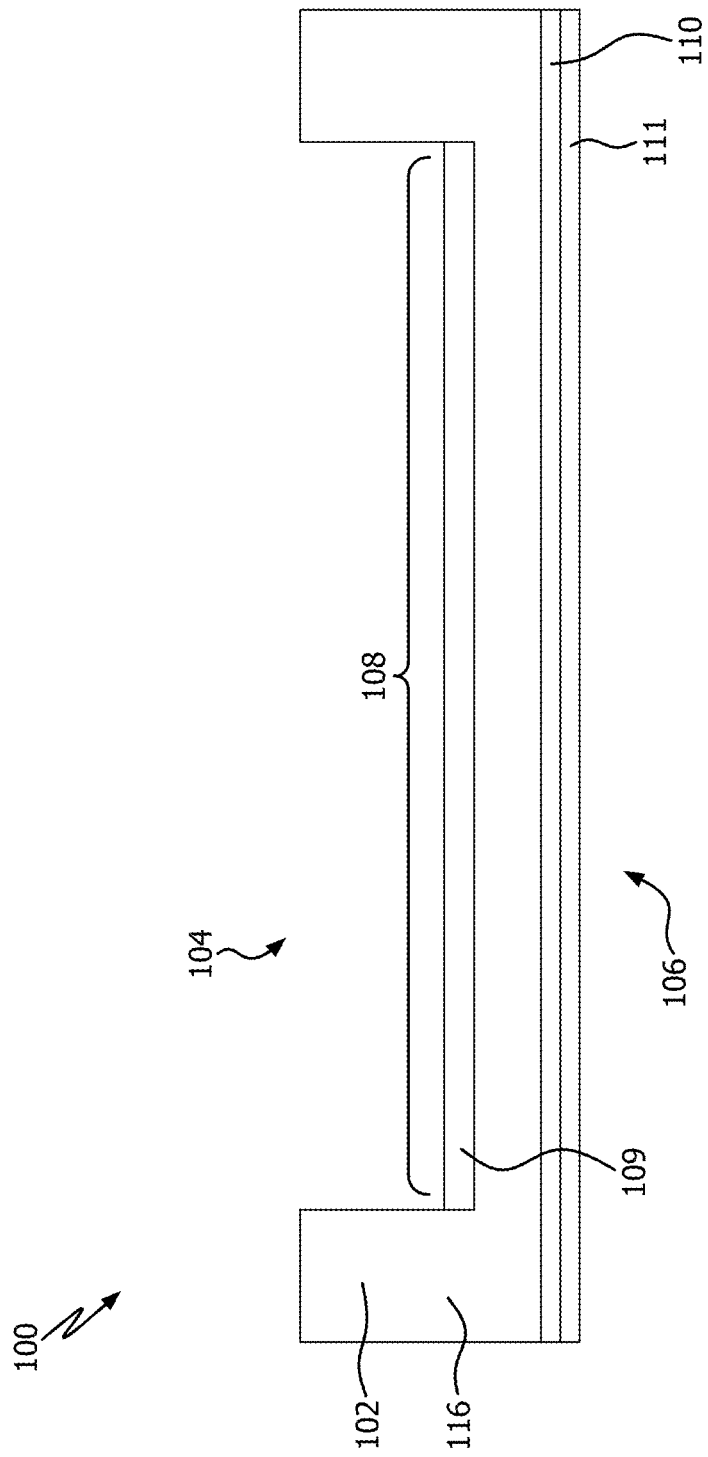
FIG. 2 is a cross-sectional view illustrating one or more layers formed on the substrate layer.
Figure 3A:
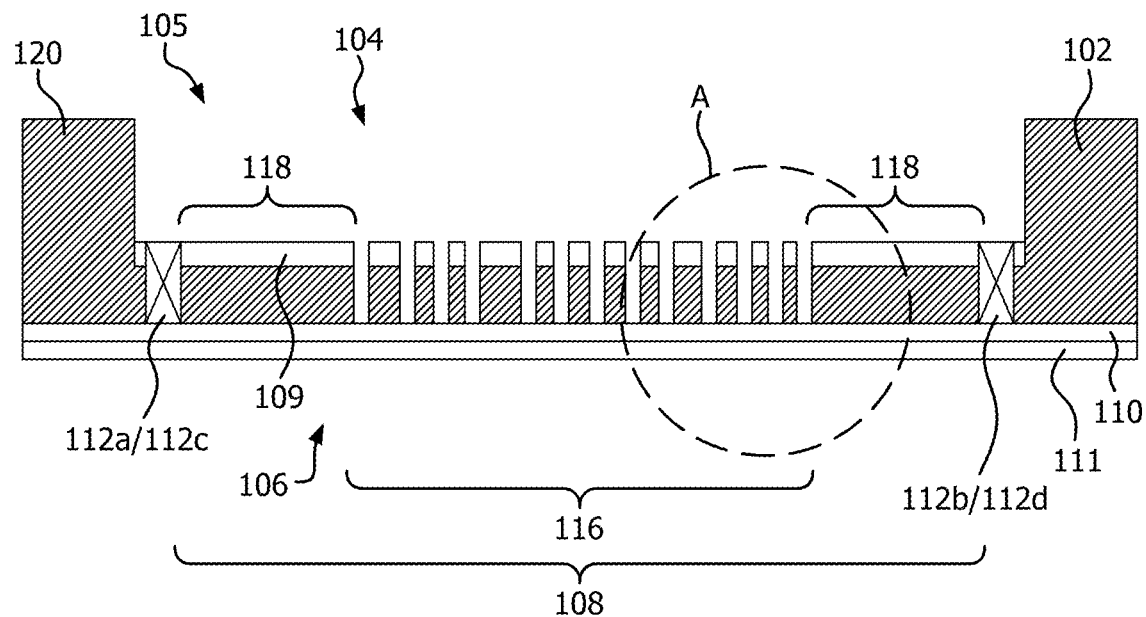
FIG. 3A is a cross-sectional view illustrating a template mask formed in the substrate layer.
Figure 3B:
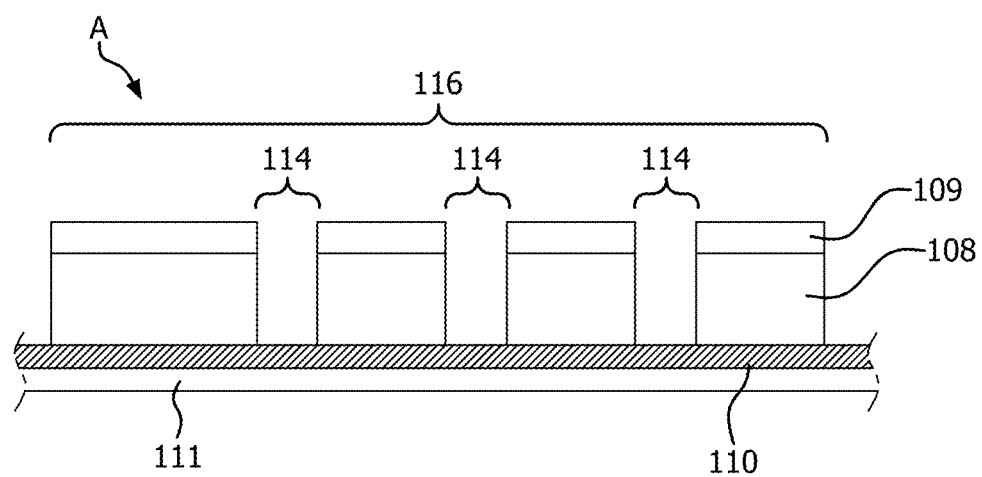
FIG. 3B is an enlarged view of the template mask formed in the substrate layer of FIG. 3A.
Figure 3C:
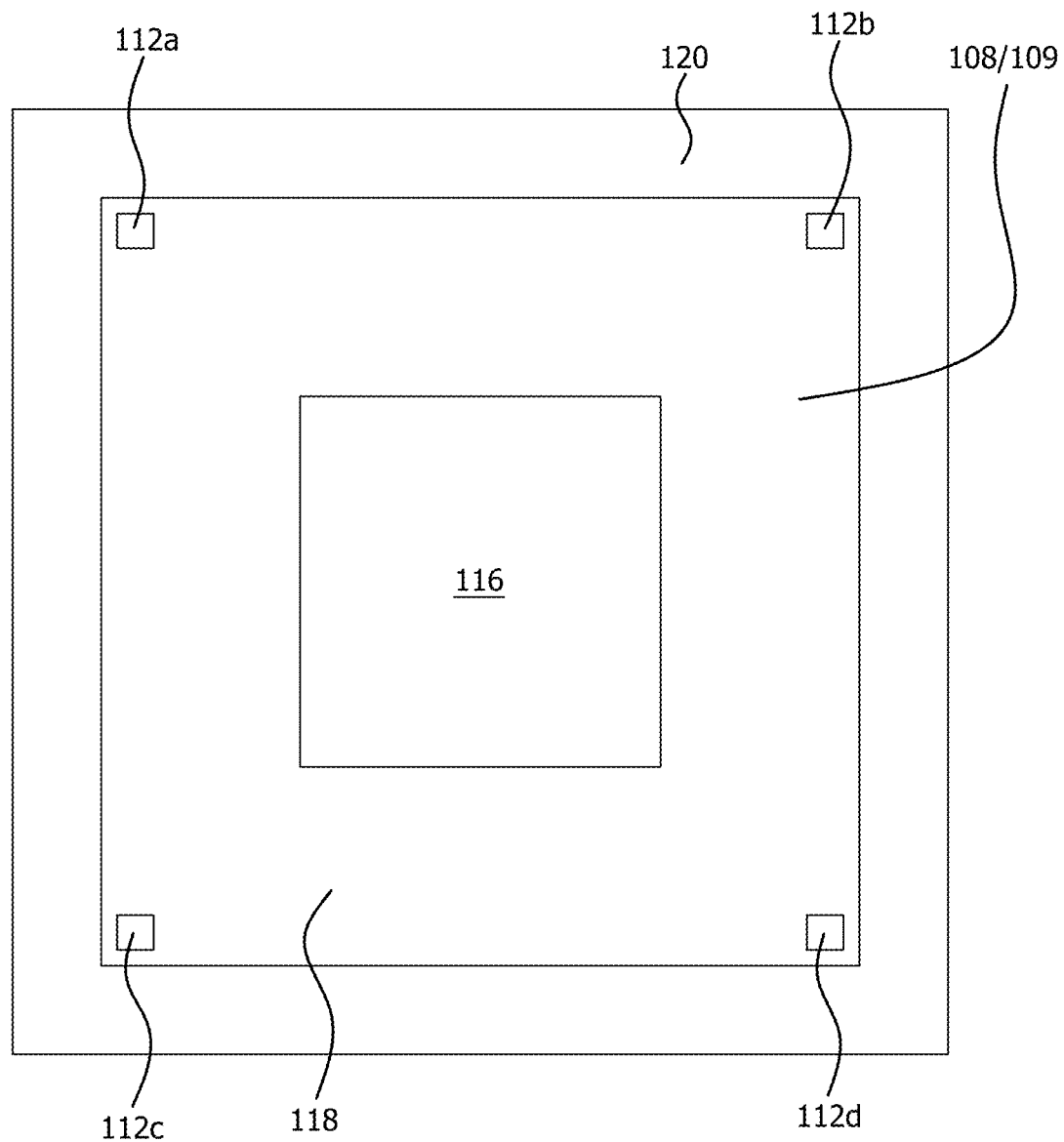
FIG. 3C is a top view of one or more mask alignment marks formed in the substrate layer of FIG. 3A.

FIGS. 1-3C illustrate a process 100 of forming a mask wafer 105 that includes a template mask 116 having a template device pattern 114. FIG. 1 illustrates a side view of a membrane 108 formed in a substrate layer 102. FIG. 2 is a cross-sectional view illustrating one or more layers formed on the substrate layer 102. FIG. 3A is a cross-sectional view illustrating the template mask 116 formed in the substrate layer 102. FIG. 3B is an enlarged view A of the template mask 116 formed in the substrate layer 102. FIG. 3C is a top view of one or more mask alignment marks formed in the substrate layer 102.

The substrate layer 102 is a semiconductor wafer composed of material, such as, silicon (Si), undoped Si, n-doped Si, p-doped Si, single crystal Si, polycrystalline Si, amorphous Si, or the like. In one or more cases, the substrate layer 102 is preferably composed of Si. Non-limiting examples of compound semiconductor materials include gallium arsenide, indium arsenide, and indium phosphide. As shown in FIG. 1, the substrate layer 102 may have a length $L_1$ of 3 centimeters (cm) to 4 cm or about 3 cm to about 4 cm by a width of 3 cm to 4 cm or about 3 cm to about 4 cm. It is noted that the size of the substrate layer 102 may vary depending on the requirements for the template device pattern 114 of the mask wafer 105.

In one or more cases, the membrane 108 may be formed in the substrate layer 102 using an etching technique, such as, for example, dry etching, reactive ion etching (RIE), wet etching, or isotropic wet etching. The membrane 108 may be a part of and formed of the same material as the substrate layer 102. One or more template device patterns 114 may be formed in the membrane 108. The membrane 108 may be etched into a top 104 of the substrate layer 102. In some scenarios the membrane 108 may have a length $L_2$ of 1 cm to 3 cm or about 1 cm to about 3 cm by a width of 1 cm to 3 cm or about 1 cm to about 3 cm, as shown in FIG. 1. In some scenarios, the thickness 108a of the membrane 108 may have a thickness that ranges from at or about 30 nanometers (nm) to 200 nm thick, and preferably be at or about 100 nm thick for a critical dimension (CD) of 10 nm and below. The CD may be the minimum line width in which a machine can write template device patterns 114 in the membrane 108. It should be noted that the thickness 108a of the membrane 108 may vary depending on structural stability requirements of the template mask 116.

In one or more cases, a first layer 110 is formed on the substrate layer 102. The first layer 110 may be formed on the back surface 106 of the substrate layer 102 using a deposition technique, such as, for example, chemical vapor deposition (CVD), plasma enhanced CVD (PECVD), thermal CVD (THCVD), sputtering, or spin-on deposition. In one or more cases, the first layer 110 may be formed on the entirety of the back surface 106, i.e., a major back surface, of the substrate layer 102. In one or more other cases, the first layer 110 may be formed on a portion of the back surface 106, a minor back surface, of the substrate layer 102 that covers the membrane 108. In one or more cases, the first layer 110 may be formed as a smooth continuous layer on the back of the membrane 108.

Figure 4:
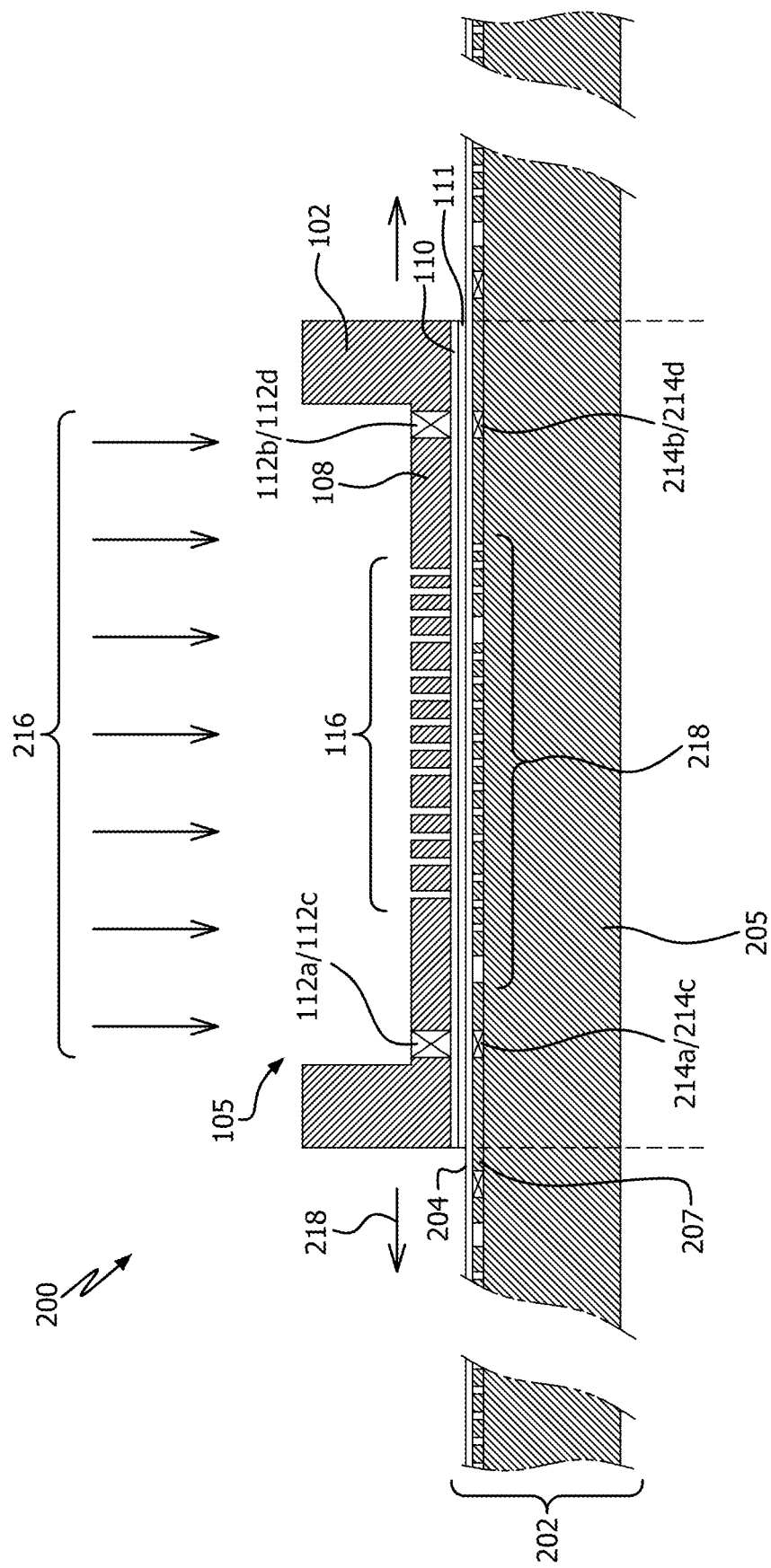
FIG. 4 is a cross-sectional view illustrating the mask alignment marks of the template mask being aligned with alignment marks of a semiconductor wafer, and writing template device patterns to the semiconductor wafer via contact printing.

In one or more cases, the first layer 110 is composed of a material having strong anti-frictional wear characteristics. For example, the first layer 110 may be composed of amorphous carbon, a diamond film, or a doped Si material, such as n-doped Si or p-doped Si. The first layer 110 may act as an etching-stop when writing template device patterns 114 into the membrane 108. By forming the first layer 110, which acts as an etching-stop, on the back surface 106 of the substrate layer 102, a variety of complex template device patterns 114 may be written into the membrane 108 by an e-beam writer. For example, instead of using a number of complementary stencil masks as used in conventional e-beam lithography, to write a donut-shaped pattern, the first layer 110 may be used to support the circular center of the donut-shaped pattern. That is, only one mask, such as the mask wafer 105, is needed to write complex template device patterns 114 into a device pattern wafer 202, as shown in FIG. 4. Moreover, the time to write the complex template device patterns 114 into the device pattern wafer 204 is reduced compared to that of a conventional e-beam lithography system, as only one mask is needed.

The thickness of the first layer 110 may be at or about 2 nm to 10 nm thick, and preferably at or about 3 nm thick. The first layer 110 is semitransparent or near transparent for the cases in which the energy range of the e-beam of the LEECOPL is 2 kilovolts (kV), about 2 kV to 8 kV or 8 kV, or more preferably 3 kV. That is, the first layer 110 in the LEECOPL may serve the same function as a quartz plate for optical lithography systems. For example, the first layer 110 allows the LEECOPL system 500 (FIG. 5C) to write various device patterns, including donut-shaped patterns, using a single template mask. In one or more cases, the first layer 110 is semitransparent or near transparent to the e-beam passing through the mask wafer 105. For example, the semitransparent first layer 110 may allow 99% or about 99% of the e-beam to pass through the semitransparent first layer 110, and may cause 1% or about 1% of the e-beam to scatter inside the semitransparent first layer 110 and exit the semitransparent first layer 110 at an angle divergent from the angle in which the e-beam entered the semitransparent first layer 110.

In one or more cases, a second layer 111 is formed on of the first layer 110. The second layer 111 may be formed on the back surface 106 of the substrate layer 102. In one or more cases, the second layer 111 may be formed on a portion of the back surface 106, a minor back surface, of the first layer 110 that covers the membrane 108. In one or more other cases, the second layer 111 may be formed on the entirety of the back surface 106, i.e., a major back surface, of the first layer 110. The second layer 111 may be formed on the back surface 106 of the first layer 110 using a deposition technique, such as, for example, CVD, PECVD, THCVD, sputtering, or spin-on deposition. The second layer 111 may include Polytetrafluoroethylene, Silicon, or other like materials that have a low coefficient of friction. For example, the coefficient of friction for polytetrafluoroethylene may be 0.05 to 0.10. The second layer 111 may protect the membrane 108 from contact friction. In one or more cases, the contact friction may be generated when positioning the mask wafer 105 on a device pattern wafer, such as the device pattern wafer 202. In one or more cases, the thickness of the second layer 111 may be at or about 3 nm.

In one or more cases, a resist layer 109 is formed on the membrane 108. The resist layer 109 may be formed on the top 104 of the membrane 108 using a deposition technique, such as, for example, CVD, PECVD, THCVD, sputtering, or, more preferably, spin-on deposition. In one or more cases, the first layer 110 and the second layer 111 are formed on the substrate layer 102 before forming the resist layer 109 on the substrate layer 102. In one or more other cases, the resist layer 109 is formed on the substrate layer 102 before forming the first layer 110 and the second layer 111 on the substrate layer 102.

In one or more cases, one or more mask alignment marks, such as mask alignment marks 112a, 112b, 112c, and 112d, are formed in the resist layer 109 and the membrane 108. The mask alignment marks 112a, 112b, 112c, and 112d may be written into the resist layer 109 and the membrane 108 using Nanoimprint Lithography (NIL) or by an e-beam writer. For the cases in which the e-beam writer is used, the top 104 of the resist layer 109 and the membrane 108 are exposed to an e-beam. The e-beam is directed towards the top 104 of the resist layer 109 and the membrane 108, and passes through the resist layer 109 and the membrane 108. The resist layer 109 and the membrane 108 may be etched to create the mask alignment marks 112a, 112b, 112c, and 112d in the membrane 108.

The mask alignment marks 112a, 112b, 112c, and 112d may be arranged around the outer portions 118 of the membrane 108 in a variety of shapes. For example, for the cases in which four mask alignment marks are used, the four mask alignment marks may be arranged in a square shape around the outer portions 118 of the membrane 108, as shown in the top view of FIG. 3C. In the square shape configuration, a mask alignment mark may be arranged orthogonal to the adjacent mask alignment marks. For instance, the mask alignment mark 112a may be arranged orthogonal to mask alignment marks 112b and 112c. In another example, three mask alignment marks may be arranged in a triangular shape around the outer portions 118 of the membrane 108. In yet another example, two mask alignment marks may be arrange linearly from one another, in which each mask alignment mark is positioned on the outer portion 118 of the membrane 108.

In one or more cases, the template device patterns 114 are written into the resist layer 109 and the membrane 108, thereby forming a template mask 116. The template device patterns 114 may be written into the resist layer 109 and the membrane 108 using NIL or by the e-beam writer. For the cases in which the e-beam writer is used, the top 104 of the resist layer 109 and the membrane 108 are exposed to an e-beam. The e-beam is directed towards the top 104 of the resist layer 109 and the membrane 108, and passes through the resist layer 109 and the membrane 108. The resist layer 109 and the membrane 108 may be etched to create the template device patterns 114 in the membrane 108. In one or more cases, the template device patterns 114 are written at the same time as the mask alignment marks 112a, 112b, 112c, and 112d. In one or more other cases, the template device patterns 114 are written before or after the mask alignment marks 112a, 112b, 112c, and 112d are written. The mask wafer 105 may include the mask alignment marks 112a, 112b, 112c, and 112d and the template mask 116 formed in the substrate layer 102. The template mask 116 may also be referred to as a parent mask. In one or more cases, the resist layer 109 may be removed after the template device patterns 116 and the mask alignment marks 112a, 112b, 112c, and 112d are formed in the mask wafer 105.

In one or more cases, a grid 120 surrounds the membrane 108 and the mask alignment marks 112a, 112b, 112c, and 112d. The height of the grid 120 may be greater than the height of the membrane 108 when viewed from the side view of the membrane 108. To position the mask alignment marks 112a, 112b, 112c, and 112d during the pattern writing process, at least a portion of the grid 120 is grabbed to move the mask wafer 105 and to align the mask alignment marks 112a, 112b, 112c, and 112d with corresponding alignment marks, such as alignment marks 214a, 214b, 214c, and 214d, on a device pattern wafer, such as device pattern wafer 202.

FIG. 4 illustrates a process 200 of aligning the mask alignment marks of the template mask 116 to the alignment marks of the device pattern wafer 202, and writing the template device patterns 114 to the device pattern wafer 202 via contact printing. FIG. 4 is a cross-sectional view illustrating the mask alignment marks 112a, 112b, 112c, and 112d of the template mask 116 being aligned with the alignment marks 214a, 214b, 214c, and 214d of the device pattern wafer 202, and the template device patterns 114 of the template mask 116 being written over one or more device patterns 218 of the device pattern wafer 202.

In one or more cases, the device pattern wafer 202 includes a third layer 204 and a fourth layer 207 formed on a semiconductor wafer 205. In one or more cases, the device pattern wafer 202 may have a diameter of 30 cm or about 30 cm. It is noted that the diameter of the device pattern wafer 202 may vary depending on the requirements for the mask pattern.

The semiconductor wafer 205 is composed of a semiconductor material, such as, Si, undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. In one or more cases, the semiconductor wafer 205 is preferably composed of Si. Non-limiting examples of compound semiconductor materials include gallium arsenide, indium arsenide, and indium phosphide.

In one or more cases, the fourth layer 207 is a membrane that includes one or more device patterns 218 and one or more alignment marks, such as alignment marks 214a, 214b, 214c, and 214d. The one or more device patterns 218 and the one or more alignment marks may be formed in a same or similar manner as the template device patterns 114 and the mask alignment marks 112a, 112b, 112c, and 112d being formed in the membrane 108. In one or more cases, the one or more device patterns 218 and the one or more alignment marks may be formed before the template mask 116 is formed in the mask wafer 105. The alignment marks 214a, 214b, 214c, and 214d may be formed in the fourth layer 207 using NIL or by the e-beam writer. The one or more device patterns 218 may be written into the fourth layer 207 using NIL or by the e-beam writer. For the cases in which the alignment marks 214a, 214b, 214c, and 214d and/or the one or more device patterns 218 are written via the e-beam writer, the top of the fourth layer 207 is exposed to an e-beam. In one or more other cases, for example in a first iteration of the lithographic writing process, the fourth layer 207 includes one or more alignment marks, such as alignment marks 214a, 214b, 214c, and 214d, and does not include the one or more device patterns 218. The third layer 204 is a resist layer formed on the fourth layer 207 using a deposition technique, such as, for example, CVD, PECVD, THCVD, sputtering, or spin-on deposition. In one or more cases, the third layer 204 may be formed on the entire top surface of the fourth layer 207. In one or more other cases, the third layer 204 may be formed on a portion of the top surface of the fourth layer 207 that covers the one or more device patterns 218. The third layer 204 may have a thickness of 30 nm or about 30 nm.

To transfer the template device patterns 114 onto the device pattern wafer 202, the mask wafer 105 is positioned on the device pattern wafer 202. In one or more cases, the mask wafer 105 may be positioned on top 104 of the device pattern wafer 202. The mask wafer 105 may be positioned on the device pattern wafer 202 by aligning the mask alignment marks 112a, 112b, 112c, and 112d of the mask wafer 105 with alignment marks, such as alignment marks 214a, 214b, 214c, and 214d, of the device pattern wafer 202. For example, the mask alignment mark 112a is aligned with the alignment mark 214a, the mask alignment mark 112b is aligned with the alignment mark 214b, the mask alignment mark 112c is aligned with the alignment mark 214c, and the mask alignment mark 112d is aligned with the alignment mark 214d. By aligning the mask alignment marks 112a, 112b, 112c, and 112d with alignment marks 214a, 214b, 214c, and 214d of a device pattern wafer 202, the relative position of the template mask 116 against a device pattern 218 on the device pattern wafer 202 is maintained during pattern writing. In one or more cases, mask alignment marks of the mask wafer 105 and the alignment marks of the device pattern wafer 202 may be aligned using a manual process, an automatic alignment process, and/or a vision system alignment process.

Having aligned the one or more mask alignment marks of the mask wafer 105 with the alignment marks of the device pattern wafer 202, the mask wafer 105 and the device pattern wafer 202 are united via a suction force, an electro-static force, or the like to hold the mask wafer 105 and the device pattern wafer 202 together during the e-beam pattern writing process. For the cases in which an electro-static force is used to unite the mask wafer 105 and the device pattern wafer 202, the LEECOPL system 500 is designed to control the contact pressure between the mask wafer 105 and the device pattern wafer 202. For example, the contact pressure used to hold the mask wafer 105 and the device pattern wafer 202 may be set to a minimum amount of pressure capable of maintaining the mask wafer 105 and the device pattern wafer 202 in a contact state. For the cases in which an electro-static force is used to unite the mask wafer 105 and the device pattern wafer 202, the mask wafer 105 and the device pattern wafer 202 are held together via van de Waals forces.

In one or more cases, the device pattern wafer 202 and the mask wafer 105 are united such that there is no gap or substantially no gap between a bottom of the device pattern wafer 202 and a top of the mask wafer 105. For example, the device pattern wafer 202 and the mask wafer 105 are united such that there is no gap or substantially no gap between the top of the third layer 204 and the bottom of the first layer 110 for the cases in which the second layer 111 is not used, or the bottom of the second layer 111 for the cases in which the second layer 111 is used. By having no gap or substantially no gap between the third layer 204 and the first layer 110, the blur of an e-beam 216 passing through the template mask 116 is either negligibly small, as shown in FIG. 5D, or there is no beam-blur due to the electron optics of the LEECOPL system 500, such as aberrations and/or space charges. Compared to conventional e-beam lithography and, for example, the LEEPL system, by having no gap or substantially no gap between the device pattern wafer 202 and the mask wafer 105 during the e-beam projection process, the resolution of the LEECOPL system 500 is greatly increased. Moreover, as the device pattern wafer 202 and the mask wafer 105 are in direct contact with one another, the heat conduction is more widely distributed throughout the mask wafer 105, allowing the LEECOPL system 500 to maintain a low temperature rise. Therefore, the LEECOPL system 500 may maintain a low distortion, in particular, for systems utilizing high throughput with high currents, such as a high powered e-beam.

Having united the mask wafer 105 and the device pattern wafer 202, the mask wafer 105 and the portion of the device pattern wafer 202 are exposed to the e-beam 216. In one or more cases, the e-beam 216 transfers the template device patterns 116 onto the third layer 204. In one or more cases, the e-beam 216 transfers the template device patterns 116 over the device pattern 218 of the device pattern wafer 202. That is, the electrons from the e-beam 216 pass through the template device patterns 114 and are exposed to the third layer 204, thereby transferring the template device patterns 114 from the template mask 116 onto the third layer 204 of the device pattern wafer 202. The mask wafer 105 may be exposed to an e-beam at or about 2 kV to 10 kV, and more preferably 3 kV.

In one or more cases, to separate the mask wafer 105 and the device pattern wafer 202, the mask wafer 105 may be moved to an edge of the device pattern wafer 202, such that the template device patterns 116 do not overlap the device pattern 218. That is, the mask wafer 105 is positioned on a pallet of a stage holding the semiconductor. By positioning the mask wafer 105 over the stage, the mask wafer 105 may be easily removed from the device pattern wafer 202. In one or more other cases, to separate the mask wafer 105 and the device pattern wafer 202, helium (He) may be introduced into grooves of the mask wafer 105 to create a floating force. The grooves may be located under the grid 120, and be positioned between the third layer 204 and at least one of the second layer 111 and the first layer 110. The floating force may cause a force to move the mask wafer 105 upwards, thereby separating the mask wafer 105 from the device pattern wafer 202.

In one or more cases, having transferred the template device patterns 114 onto the device pattern wafer 202, the mask wafer 105 may be aligned and united with another portion of the device pattern wafer 202. The mask wafer 105 may be aligned and united with the other portion of the device pattern wafer 202 in a same or similar manner as described herein. Having united the mask wafer 105 with the other portion of the device pattern wafer 202, the mask wafer 105 and the other portion of the device pattern wafer 202 are exposed to the e-beam 216, in which the e-beam 216 transfers the template device patterns 116 onto the other portions of the device pattern wafer 202 and/or over a device pattern of the other portion of the device pattern wafer 202. In one or more cases, the align, unite, and e-beam exposure process may be repeated on one or more additional portions of the device pattern wafer 202. For example, the align, unite, and e-beam exposure process may be repeated over each device pattern area of the device pattern wafer 202. In one or more cases, the LEECOPL system 500 includes processes 100 and 200. By including the first layer 110 on the mask wafer 105, the LEECOPL is a single mask e-beam lithography system that does not need to utilize complementary masks as used in LEEPL.

Figure 5A:
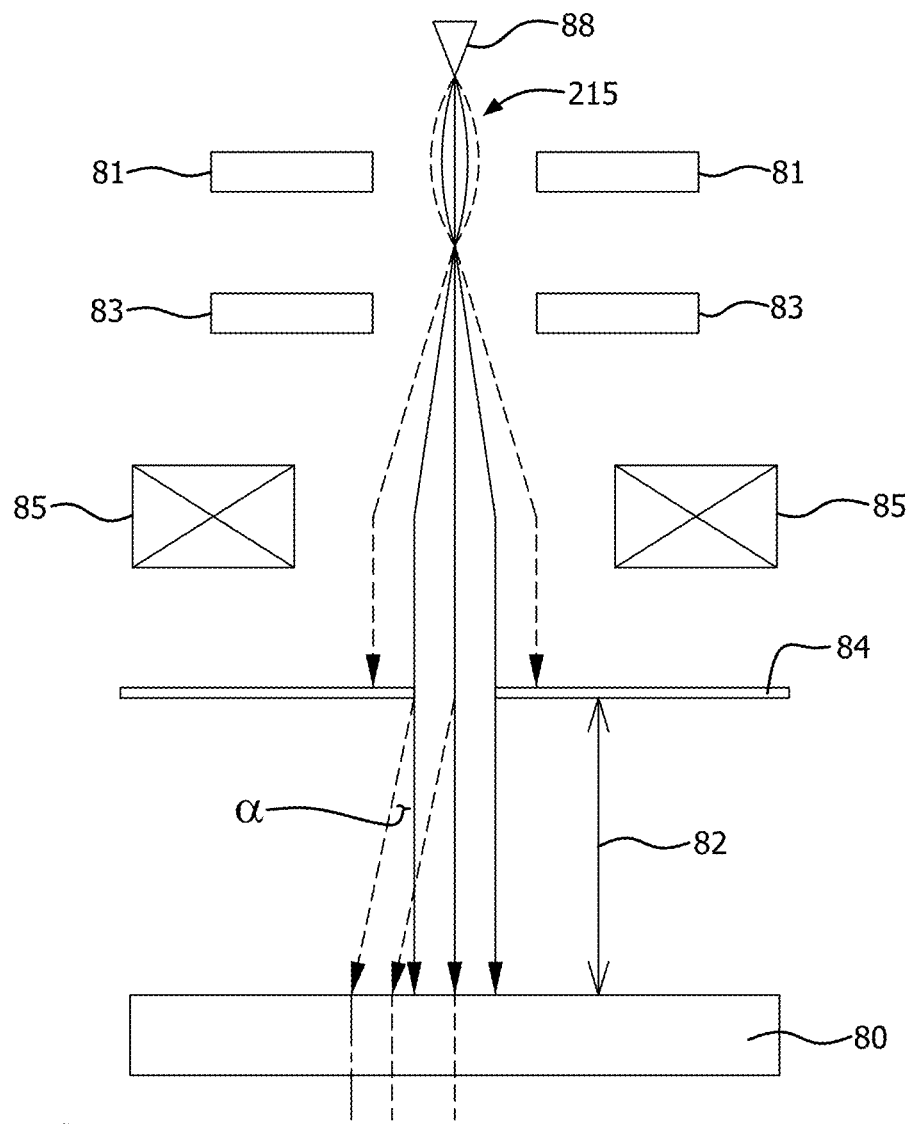
FIG. 5A illustrates an example of E-optics and beam blur for a LEEPL system.
Figure 5B:
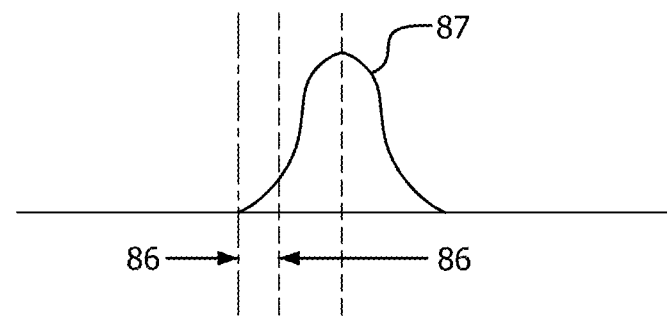
FIG. 5B illustrates a graphical representation of a beam blur profile for the LEEPL system of FIG. 5A.
Figures 5C, 5D:
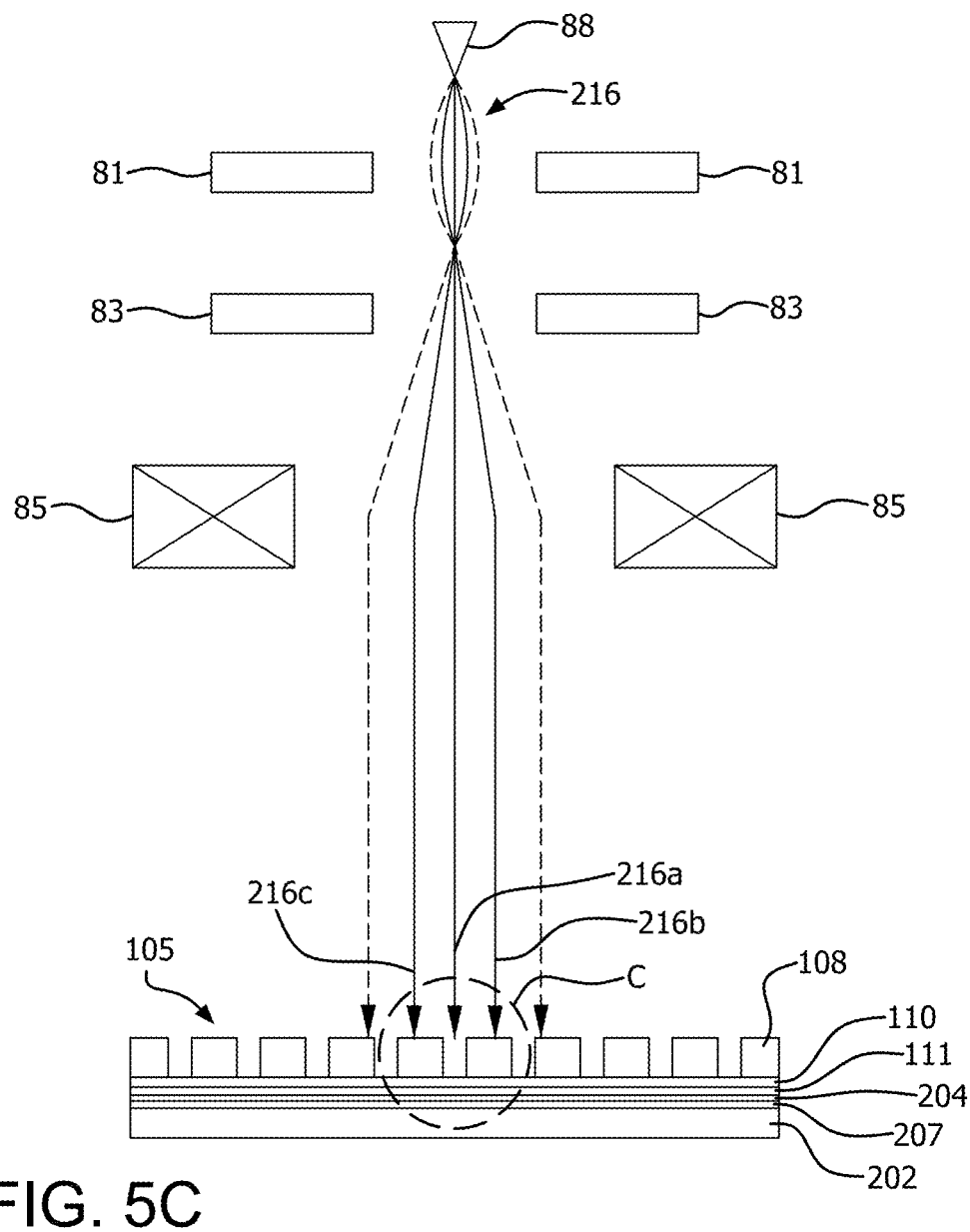
FIG. 5C illustrates an example of E-optics and beam blur for a LEECOPL system.
FIG. 5D illustrates a graphical representation of a beam blur profile for the LEECOPL system of FIG. 5C.
Figure 5E:
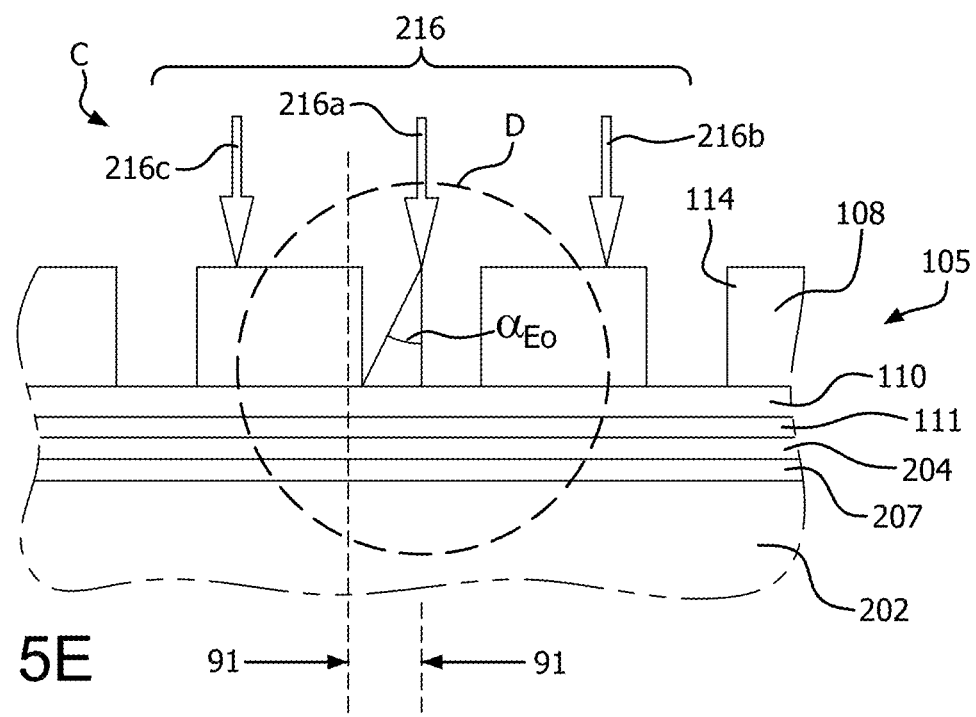
FIG. 5E is an enlarged view of an example E-optics path and beam blur for the LEECOPL system of FIG. 5C.
Figure 5F:
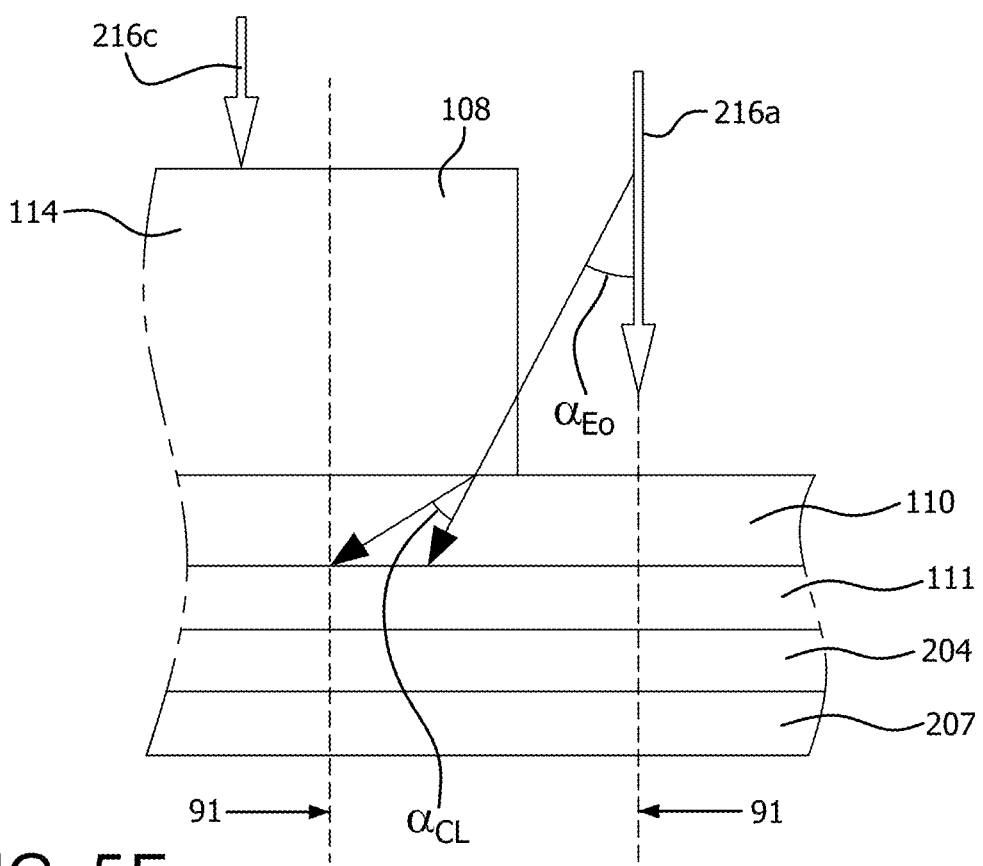
FIG. 5F is an enlarged view of an example E-optics path and beam blur for the LEECOPL system of FIG. 5D.

FIG. 5A illustrates an example of E-optics and beam blur for a LEEPL system. FIG. 5B illustrates a graphical representation of a beam blur profile 87 for the LEEPL system of FIG. 5A. FIG. 5C illustrates an example of E-optics and beam blur for a LEECOPL system 500. FIG. 5D illustrates a graphical representation of a beam blur profile 89 for the LEECOPL system 500 of FIG. 5C. FIG. 5E is an enlarged view of an example path E-optics and beam blur for the LEECOPL system 500 of FIG. 5C. FIG. 5F is an enlarged view of an example path E-optics and beam blur for the LEECOPL system 500 of FIG. 5C.

In the LEEPL system, during the e-beam exposure process, a mask 84 is separated from a wafer 80 by a gap distance 82. The gap distance 82 may be, for example, 40 micro meters. During the e-beam exposure process, an e-beam, such as the e-beam 215, is emitted from an emitter 88. The e-beam 215 passes from the emitter 88 though a wehnelt 81, an anode 83, a lens 85 and towards the mask 84. The mask 84 allows a portion of the e-beam 215 to pass through the mask 84 and prevents another portion of the e-beam 215 from passing through the mask 84. As the e-beam 215 moves through the gap distance 82, the e-beam 215 diverges by an angle $\alpha$ before contacting the wafer 80. The e-beam 215 may have a beam blur 86 of about 4 nanometers, as shown by the beam profile 87 in FIG. 5B.

In the LEECOPL system 500, contrary to the LEEPL system and conventional e-beam lithography, during the e-beam exposure process, the device pattern wafer 202 and the mask wafer 105 are united such that there is no gap or substantially no gap between the top of the third layer 204 and the bottom of the first layer 110. During the e-beam exposure process, the e-beam 216 is emitted from an emitter 88. The e-beam 216 passes from the emitter 88 though the wehnelt 81, the anode 83, the lens 85 and towards the mask wafer 105. As a portion 216a of the e-beam 216 passes the membrane 108, the portion 216a of the e-beam 216 may diverge by an angle $\alpha_{ED}$. The portion 216a of the e-beam 216 may further diverge by an angle $\alpha_{CL}$ when passing through the first layer 110. The e-beam 216 may have a beam profile 89, as shown in FIG. 5D.

Figure 6:
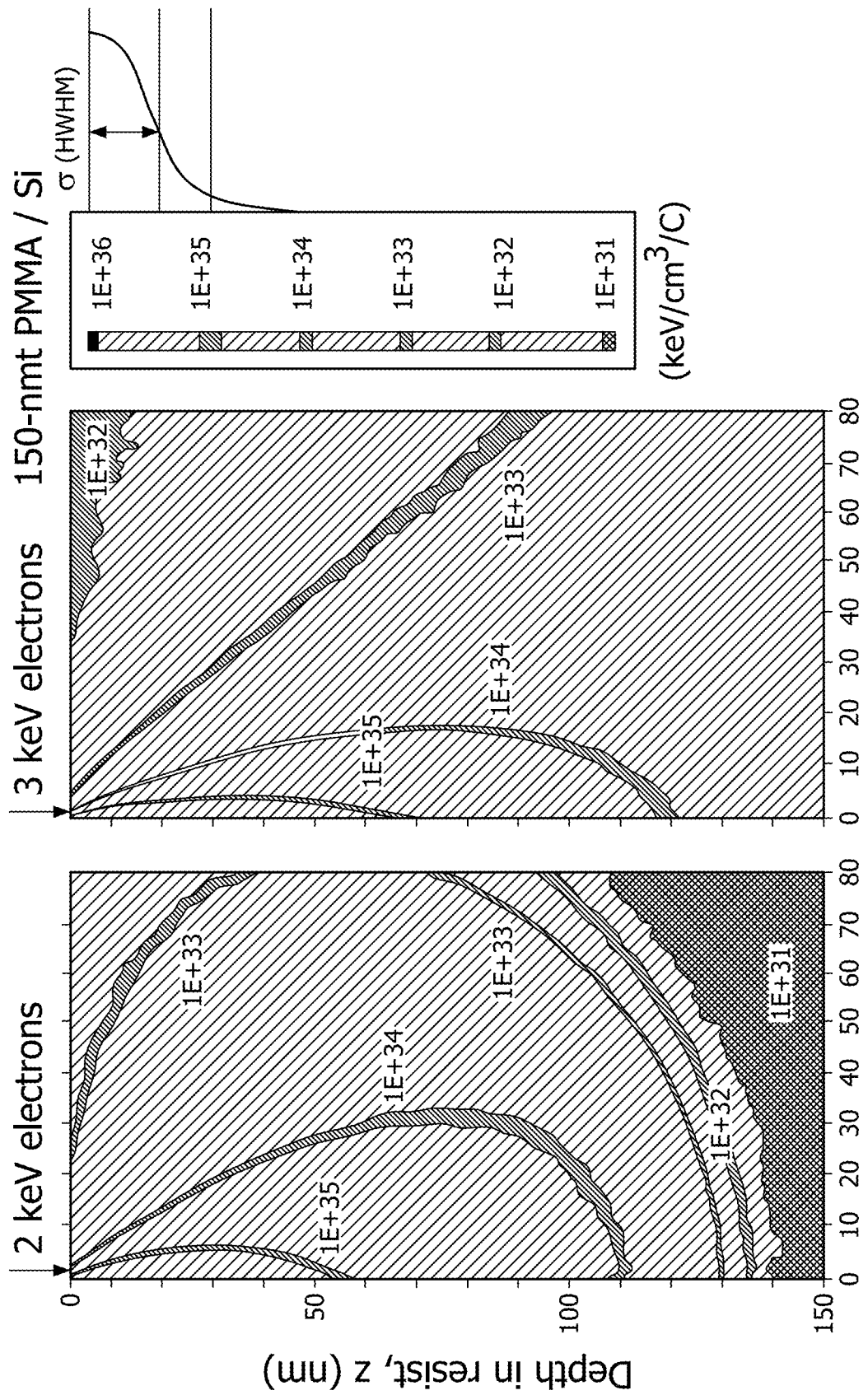
FIG. 6 is a simulation illustrating a primary electron's forward-scattering profile.
Figure 7:
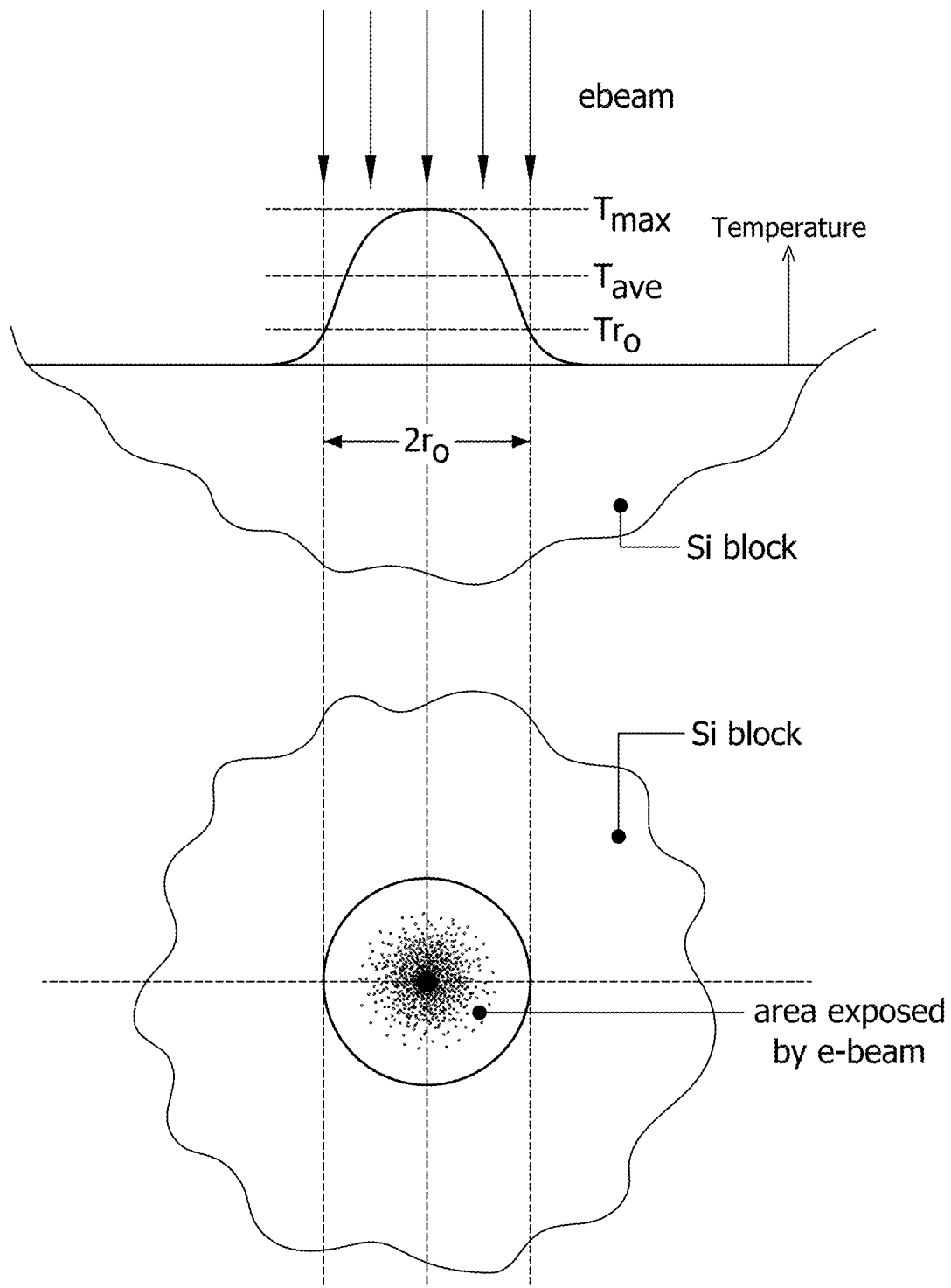
FIG. 7 illustrates a temperature rise causing thermal distortion of a mask wafer and the device pattern wafer.

FIG. 6 is a simulation of a primary electron's forward-scattering profile. FIG. 7 illustrates a temperature rise causing thermal distortion of the mask wafer 105 and the device pattern wafer 202.

Resolution ($R_{L/S}$) of LEECOPL:

The resolution of the LEECOPL system 500 may be estimated using the e-beam systems resolution formula. (Yamashita Jpn, J. Appl. Phys 44 (2004) 5590). According to the formula, the resolution: ($R_{L/S}$ line and space resolution) can be obtained from (a) the forward scattering range of the primary electrons in the resist: $\beta'_{f(nm)}$, and (b) the beam blur: $\rho^{(nm)}$ of the e-beam system as $$R_{L/S}=3\sqrt{(\beta_f^2+\rho^2)} \quad (1)$$

in which $R_{L/S}$ (nm) is the resolution, $\beta_f$ is the forward scattering range, and $\rho$ is the beam blur that is caused by the divergence of the e-beam, i.e., the deviation from the parallelism of the e-beam.

In order to estimate the beam blur 93 for LEECOPL, the beam blur for the LEEPL system may be estimated. For example, the e-beam optics of the LEEPL system may have a large gap distance 82 of 40 μm between the mask 84 and the resist layer on the wafer 80 and a measured beam blur 86 of 4 nm. Regarding the LEECOPL system 500 that has no gap distance, the thickness of the membrane 108, as shown in FIG. 5C, may serve as the corresponding gap in the LEECOPL system 500. Therefore, assuming LEECOPL's e-optics is the same as that of LEEPL, the beam blur of LEECOPL system 500, i.e., $(\rho_{E.O})_{LEECOPL}$, can be obtained as follows:

$$(\rho_{E.O})_{LEECOPL}=\rho_{LEEPL}\cdot(membrane\ thickness\ of\ LEECOPL)/$$
$$(gap\ distance\ between\ mask\ and\ resist\ of\ LEEPL)=4\ nm\times$$
$$(100\ nm/40\times10^3\ (nm))=1\times10^{-2}\ (nm) \quad (2)$$

in which ρLEEPL is the beam blur of the LEEPL system, e.g., 4 nm; the gap distance between mask 84 and the resist layer on the wafer 80 of LEEPL is 40 μm; and the thickness of the membrane 108 of the LEECOPL system 500 is 100 nm.

A computer simulation, as shown in FIG. 6, may obtain the beam blur 93 due to the e-beam scattering by first layer 110, $(\rho_{C.L})$. The value of $(\rho_{C.L})$ is estimated to be 0.18 nm at 2 kV. The total e-beam blur of LEECOPL system 500 may be $(\rho_{E.O})+(\rho_{C.O})=0.01+0.18\ nm=0.192\ nm\div0.2\ nm$. Likewise, the forward scattering of the primary electron in resist, $\beta_f$, can be obtained by computer simulation, as shown in FIG. 7. The values of $\beta_f$ at the beam energy of 2 kV, 3 kV, 5 kV and 8 kV may be estimated as 4.5 nm, 3.0 nm, 1.8 nm, and 1.2 nm, respectively. The total e-beam blur, 0.2 nm, is smaller than $\beta_f$ of equation (1). Therefore, the resolution, $R_{L/S}$, of LEECOPL system 500 may be determined by the forward-scattering range $\beta_f$ as $$R_{L/S}=3\sqrt{(\beta_f^2+\rho^2_{total})}\div3\sqrt{\beta_f^2} \quad (3)$$

Summarizing the above result, the resolution of LEECOPL system 500 at various voltages is shown in Table 1.

TABLE 1

Resolution $R_{L/S}$ (nm) of LEECOPL at various e-beam energy

| Beam Energy (kV) | Resist Thickness (nm) | βf (nm) | $R_{L/S}$ (nm) |
|---|---|---|---|
| 2 | 20 | 4.5 | 13.5 |
| 3 | 25 | 3.0 | 9.0 |
| 5 | 30 | 1.8 | 5.4 |
| 8 | 35 | 1.2 | 3.6 | in which the resist thickness is assumed as the beam penetrating depth where the forward-scattering goes to zero.

Thermal Distortion of the LEECOPL system 500:

As the membrane 108, the first layer 110, the second layer 111, the third layer 204, and the fourth layer 207 of the LEECOPL system 500 are in a physical contact state, the membrane 108, the first layer 110, the second layer 111, the third layer 204, and the fourth layer 207 of the LEECOPL system 500 may be considered thermally combined as one solid body. The thickness of the membrane 108, the first layer 110, the second layer 111, the third layer 204, and the fourth layer 207 may be smaller (e.g., at or about 200 nm) in comparison to the diameter of the exposed area (e.g., at or about 300 mm) of the device pattern wafer 202. Thus, it may be assumed that the temperature rise of these combined layers may be nearly the same as the temperature rise of the surface of the Si block model, as shown in FIG. 7, which is exposed to the e-beam. Moreover, the penetrating distance of a 3 kV e-beam may be within 200 nm, thus the total energy of the e-beam is deposited within these combined layers. Using the simulated model in FIG. 7, the temperature rise of the LEECOPL mask wafer 105 is calculated in a closed form by the following equation.

$$T_{max}=\rho\pi r_0/4K\sqrt{\pi}=\pi T_{ave}$$

in which $T_{(r)}$ is the temperature rise at the position r (cm), p is the input power density (W/cm$^2$), $r_0$ is the radius of the bombarded area (cm), and K is thermal conductivity of Si block (W/cm° C.).

Assuming K of Silicon is 1.5 (W/cm° C.), $T_{max}$(° C.) may be obtained for currents: I(mA)=1 mA, 2 mA, and 3 mA, in which the energy (E) of the e-beam: E=2 kV, 3 kV, 5 kV, and 8 kV, the power (P) of the e-beam is shown in Table 2 below, and the radius of the membrane size $r_0$=1.5 cm.

TABLE 2

($T_{max}$): Maximum temperature rise of LEECOPL at various e-beam input energy

| I(mA) | E(kv) | P(w) | Tmax (° C.) |
|---|---|---|---|
| 1 | 2 | 2 | 0.073 |
|   | 3 | 3 | 0.11 |
|   | 5 | 5 | 0.18 |
|   | 8 | 8 | 0.29 |
| 2 | 2 | 4 | 0.15 |
|   | 3 | 6 | 0.22 |
|   | 5 | 10 | 0.36 |
|   | 8 | 16 | 0.58 |
| 3 | 2 | 6 | 0.22 |
|   | 3 | 9 | 0.33 |
|   | 5 | 15 | 0.54 |
|   | 8 | 24 | 0.90 |

$(T_{max})_0$, as shown above in Table 2, is the steady-state temperature rise while the time of exposure is infinite. Therefore, the actual temperature rise, $T_{actual}$, may be lower than $(T_{max})_0$.

$$T_{actual}<(T_{max})_0 \quad (6)$$

In order to estimate the maximum thermal distortion, $(D_{max})_0$, of the LEECOPL system 500, caused by $(T_{max})_0$, the experimental data of $(T_{max})_t=8°$ K, $(D_{max})_t=30$ nm, and $r_1=2.0$ cm, obtained in the case of LEEPL without thermal distortion correction, is applied to the following proportional relationship as follows:

$$(D_{max})_0/(D_{max})_1 = r_0/r_1 \cdot (T_{max})_0/(T_{max})_1 \quad (7)$$

Thus $$(D_{max})=(D_{max})_1 \cdot r_0/r_1 \cdot (T_{max})_0/(T_{max})_1 = 2.8 \times (T_{max})_0,$$
where $(D_{max})_1=30$ nm, $r_0=1.5$ cm, and $r_1=2.0$ cm $\quad (8)$ Hence, the estimated maximum thermal distortion, $(D_{max})_0$, of the LEECOPL system 500 at various power inputs can be obtained, as shown in Table 3. As shown in Table 3, the LEECOPL system 500 can be used to write patterns with the resolution of a few nanometers, which has a substantially small distortion, $(D_{max})$, of 0.4 nm at the largest current of 3 mA and energy of 5 kV. Both the resolution and thermal distortion of LEECOPL at various input power are summarized in Table 3. The final accuracy of the LEECOPL system 500 may be provided by adding the line and space resolution ($R_{L/S}$) with the maximum thermal distortion ($D_{max}$). $D_{max}$ may be the outward expansion due to the temperature rise generated by the input power. Therefore, the CD of the LEECOPL system 500 may be considered as adding the line and space resolution ($R_{L/S}$) with the maximum thermal distortion ($D_{max}$).

TABLE 3

Resolution and Thermal Distortion of LEECOPL at various input power.

| Energy (kV) | Current (mA) | Power (W) | $T_{max}$ (° C.) | $D_{max}$ (nm) | $R_{L/S}$ (nm) | CD (nm) |
|---|---|---|---|---|---|---|
| 1.0 | 2.0 | 2.0 | 0.073 | 0.2 | 13.5 | 13.7 |
| 2.0 | 1.0 | 2.0 | 0.073 | 0.2 | 13.5 | 13.7 |
| 1.0 | 1.0 | 1.0 | 0.036 | 0.1 | 13.5 | 13.6 |
| 2.0 | 0.5 | 1.0 | 0.036 | 0.1 | 13.5 | 13.6 |
| 2.0 | 1.5 | 3.0 | 0.11 | 0.3 | 13.5 | 13.8 |
| 1.0 | 1.0 | 3.0 | 0.11 | 0.3 | 9.0 | 9.3 |
| 2.0 | 2.5 | 5.0 | 0.18 | 0.5 | 13.5 | 14 |
| 3.0 | 1.7 | 5.0 | 0.18 | 0.5 | 9.0 | 9.5 |
| 5.0 | 1.0 | 5.0 | 0.18 | 0.5 | 5.4 | 5.9 |
| 3.0 | 2.7 | 8.0 | 0.29 | 0.8 | 9.0 | 9.8 |
| 5.0 | 1.6 | 8.0 | 0.29 | 0.8 | 5.4 | 6.2 |
| 8.0 | 1.0 | 8.0 | 0.29 | 0.8 | 3.6 | 4.4 |

Throughput of the LEECOPL system 500:

In a particulate e-beam system, such as LEEPL and LEECOPL, the statistical variation called Shot Noise may be compensated in order to obtain high quality imaging on the third layer 204. For example, the Shot Noise may be required to meet the ITRS's Criterion for the LER (Line Edge Roughness) Requirement. For exposure, if a number of electrons per $CD^2$ is 600, then the above criterion for the LER requirement is met. ("Shot Noise Effect and Throughput in LEEPL System" T. Utsumi Proc. of SPIE, Vol 6517, 65172 J (2007), Emerging Lithographics Technologies XI. Edited by M. J. Lercel, Advanced Semi-conductor Lithography Workshop, 2007, Puerto Rico). Therefore, the number of electrons per $CD^2$ at 1 mA×1 sec, assuming CD=10 nm, can be obtained as follows.

The current density of 1 mA per LEECOPL mask having a diameter do of 3.0 cm is $i_0=0.062$ (mA/cm$^2$); the electron flow per second cm$^2$ for 1 mA is $n_0=3.9 \times 10^{14}$ (number of electrons/mA·sec.·cm$^2$); and the electron flow per second $CD^2$ for 1 mA, where CD=10 nm is $n_0=3.9 \times 10^2$ (number of electrons/mA·sec.·$CD^2$). The time needed to fill up 600 electron per $CD^2$ area is $t_{cd}=1.53$ sec. The time to cover the diameter do of 300 mm for the device pattern wafer 202 in a step and repeat motion may be $t_{102}=15$ cm×15 cm×3.14/4 cm×4 cm=67.3 sec.

The throughput of 300 mm device pattern wafer 202 per hr at I=1 mA, CD=10 nm is $$N_{Wafer}^{1 \, mA} = 3600 \text{ sec}/67.3 \text{ sec} = 53.5 (300 \text{ mm}\varphi W/hr) \quad [11]$$

The throughput of the LEECOPL system 500 for CD=16 nm, 10 nm, and 5 nm at various currents is provided in Table 4.

TABLE 4

Throughput of LEECOPL for CD = 16 nm, 10 nm, and 5 nm at various currents.

|  | CD = 16 nm | CD = 10 nm | CD = 6 nm |
|---|---|---|---|
| 1 mA | 136 W/hr | 53 W/hr | 20 W/hr |
| 2 mA | 272 W/hr | 107 W/hr | 40 W/hr |
| 3 mA | 408 W/hr | 160 W/hr | 60 W/hr |
| 5 mA | 686 W/hr | 267 W/hr | 100 W/hr |

E-optics of the LEECOPL system 500:

The beam blur of the LEECOPL system 500 is essentially negligible in comparison to the conventional LEEPL e-beam projection system. Therefore, the LEECOPL system 500 does not require a sophisticated field emission e-beam optics. However, the LEECOPL system 500 may require a rather large current in its optics, as the area for beam exposure may be as large as 15 cm×15 cm×3.14=706 cm$^2$, which corresponds to the size of 300 mm$\varphi$ of the device pattern wafer 202. The appropriate current range for the system is considered to be 1 mA~3 mA. As to the form of the e-beam optics, either scanning exposure type or overall exposure type may be used.

In one or more cases, direct contact between the membrane 108 and the third layer 204 and friction caused by the motion between the surfaces of the membrane 108 and the third layer 204 may cause damage to the patterned membrane 108. By forming a continuous and smooth first layer 110 of amorphous carbon on the membrane 108, additional layers may be added to the first layer 110 to protect the patterned membrane 108 and minimize friction between the patterned membrane 108 and the third layer 204. For example, the second layer 111, being a nonstick coating, such as polytetrafluoroethylene or Teflon™, may be applied to the first layer 110 and/or the third layer 204 to minimize the friction between the first layer 110 and the third layer 204. In another example, a super-accuracy air-bearing stage may be used for the align, unite, e-beam exposure, and repeat process. Such high-precision air-bearing stages are well-known in the art and are commercially available from a variety of different sources. Air bearings avoid friction, wear and backlash effects, and these characteristics make them well-suited for applications in the semiconductor manufacturing field. Such, commercially available air-bearing stages can include nanopositioning systems with positional accuracy capability in the nanometer range. With suitable actuators provided, air bearing stages can facilitate movement of a mask wafer in x, y and z directions so as to perform the align, unite, and repeat process whereby e-beam exposure can take place with the mask situated on the device pattern wafer.

The super-accuracy air-bearing stage may maintain a gap of a few nanometers between the first layer 110 and the third layer 204. The super-accuracy air-bearing stage may maintain the gap of to 1 nm or about 1 nm during contact printing of the align, unite, e-beam exposure, and repeat process. Having separated the first layer 110 and the third layer 204 via the super-accuracy air-bearing stage, a chemically stable, low-vapor pressure lubricant may be introduced in the gap between the first layer 110 and the third layer 204. The lubricant may include, for example but not limited to, silicon based materials.

Resolution, $R_{L/S}$, of the LEECOPL system 500 may be determined using a single parameter, which is the forward-scattering range of primary electrons in the third layer 204. This is possible because beam blur in the LEECOPL contact printing is negligibly small in comparison to the forward scattering range. The final accuracy, which is the CD, of the pattern obtained after the exposure and development of the third layer 204 may be provided by adding the line and space resolution ($R_{L/S}$) due to the forward-scattering in the third layer 204 with the maximum thermal distortion ($D_{max}$) due to the outward expansion of a temperature rise generated by input power. The thermal distortion ($D_{max}$), which may indicate the performance of the LEECOPL system 500, is determined by the input power of the exposure (W). The critical distance (CD) of the LEECOPL system 500 may be, for example,

| E(kv) | P(w) | $T_{max}$ (° C.) | $D_{max}$(nm) | R(L/S)(nm) | CD(nm) |
|---|---|---|---|---|---|
| 2 | 2 | 0.073 | 0.36 | 13.5 | 14 |
| 3 | 3 | 0.11 | 0.54 | 9.0 | 9.54 |
| 5 | 5 | 0.18 | 0.9 | 5.4 | 6.3 |
| 8 | 8 | 0.29 | 1.44 | 3.6 | 5.0 |

The throughput $N_w$ (300 mm$\varphi$Wafer/Hr) may be $$N_w = 320 \ (W/H_r) \text{ for } CD = 16 \text{ nm} \brace N_w = 120 \ (W/H_r) \text{ for } CD = 10 \text{ nm}} \text{ at } I = 3 \text{ mA}$$

$$N_w = 50 \ (W/H_r) \text{ for } CD = 6 \text{ nm}$$

Moreover, the LEECOPL system 500 may utilize a long depth of focus (DOF) that is more suitable for the process of 3D integration than the shallow DOF of conventional optical systems. 3D integration may describe techniques that extend beyond fine Field Effect Transistors (FET) and tall wiring stacks. 3D integration may be used for a large integration of transistors by volume rather than area.

Figure 8A:
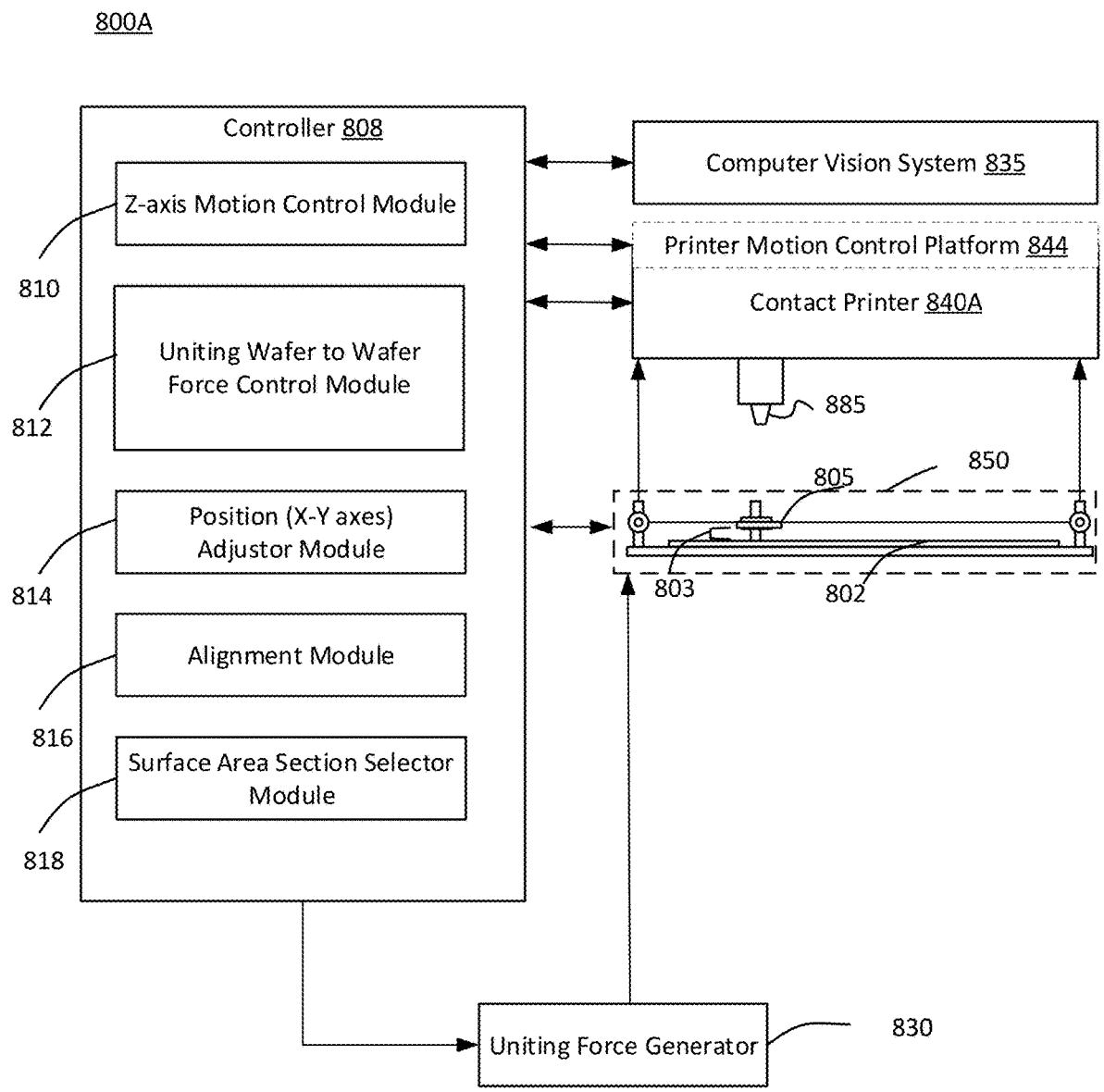
FIGS. 8A-8C illustrate a first LEECOPL system with contact-free positioning and alignment stage for a non-stationary wafer with the non-stationary wafer in different positions.
Figure 11A:
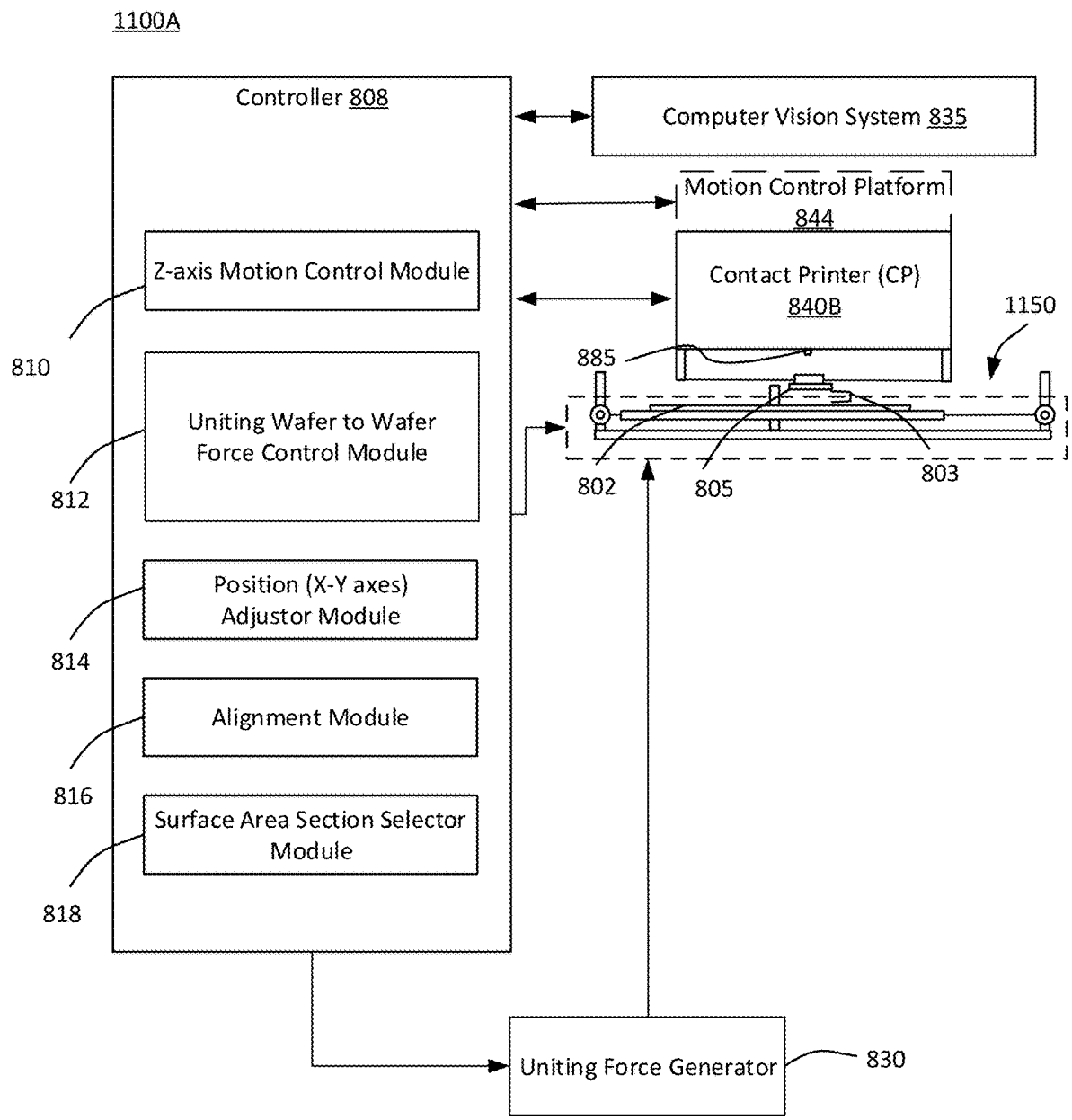
FIGS. 11A-11C illustrate a second LEECOPL system with contact-free positioning and alignment stage for a non-stationary wafer in different positions.

FIGS. 8A and 11A illustrate LEECOPL systems 800A and 1100A with a contact-free positioning and alignment stage for a non-stationary wafer. The contact-free positioning and alignment stage is configured to control the movement of a non-stationary wafer relative to a stationary wafer. In some embodiments, the contact printer may be stationary and have a stationary wafer affixed thereto. In this instance, the mask wafer may be the stationary wafer and the device pattern wafer may be the non-stationary wafer.

In other embodiments, the contact printer may be configured to move in at least one direction. Accordingly the mask wafer affixed to the contact printer may be a non-stationary wafer and the device pattern wafer may be the stationary wafer. If the contact printer moves in only one or two directions, then the contact-free positioning and alignment stage may control the contact printer's movements in the at least one or two directions. The non-stationary wafer (i.e., mask wafer) may move independently in those directions that the contact printer cannot move, for example.

It will be understood that the mask wafer is usually much smaller in diameter as compared to the device pattern wafer. The contact-free positioning and alignment stage is provided to precisely control the up-down (Z axis) motion, the X-Y translation motion and the alignment motion of the non-stationary wafer relative to the stationary wafer. Further, it should be understood that a function of the contact-free positioning and alignment stage necessarily involves closing the gap between the stationary wafer and the non-stationary wafer. The alignment stage is therefore advantageously configured to facilitate gently positioning of the non-stationary wafer with precision and accuracy. In some embodiments, the contact-free positioning and alignment stage may be configured to control the uniting of the non-stationary wafer with the stationary wafer by a uniting force via a suction force, an electro-static force, or the like to hold the stationary wafer and the non-stationary wafer together during the e-beam pattern writing process.

Figure 8B:
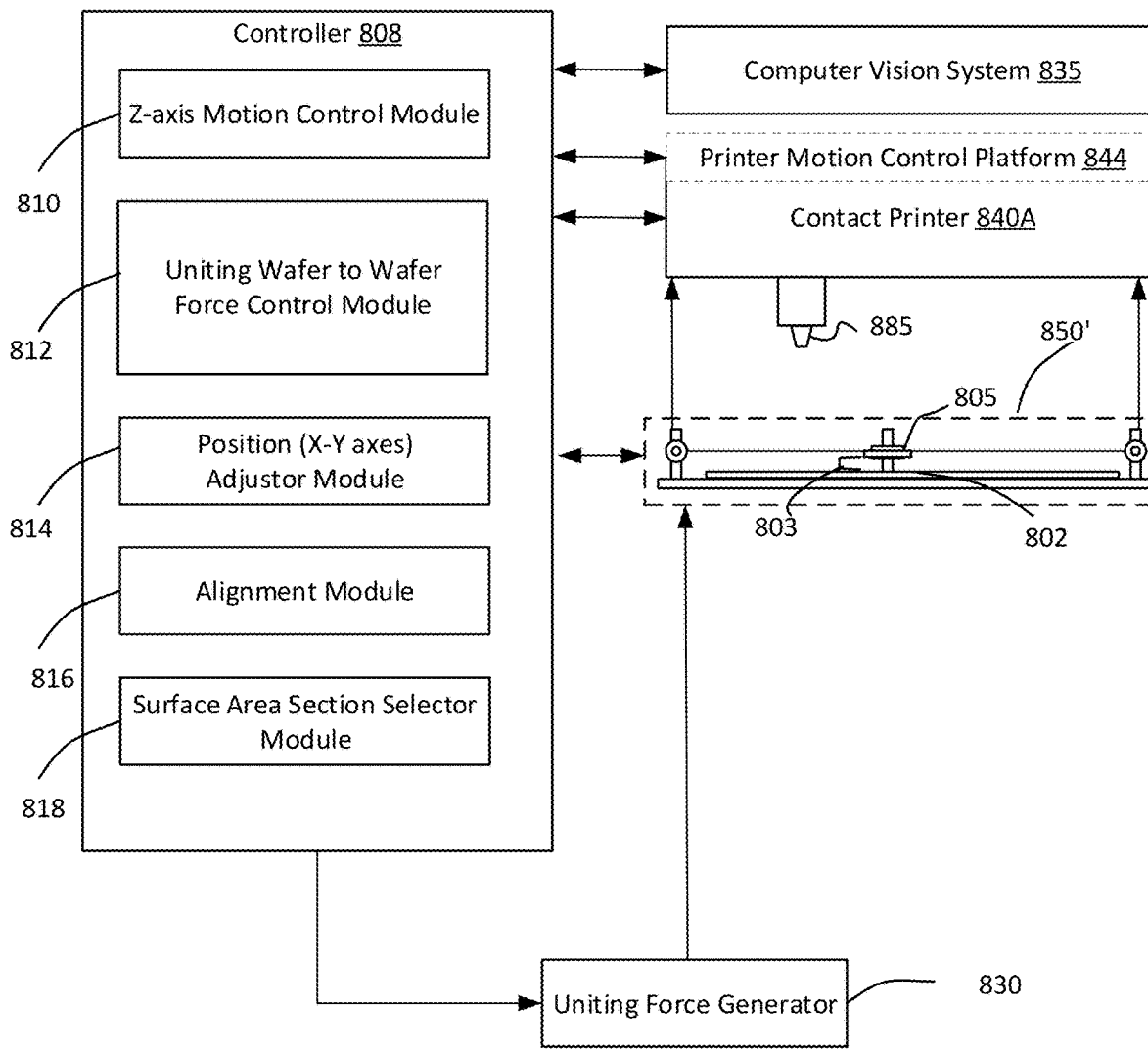
Figure 8C:
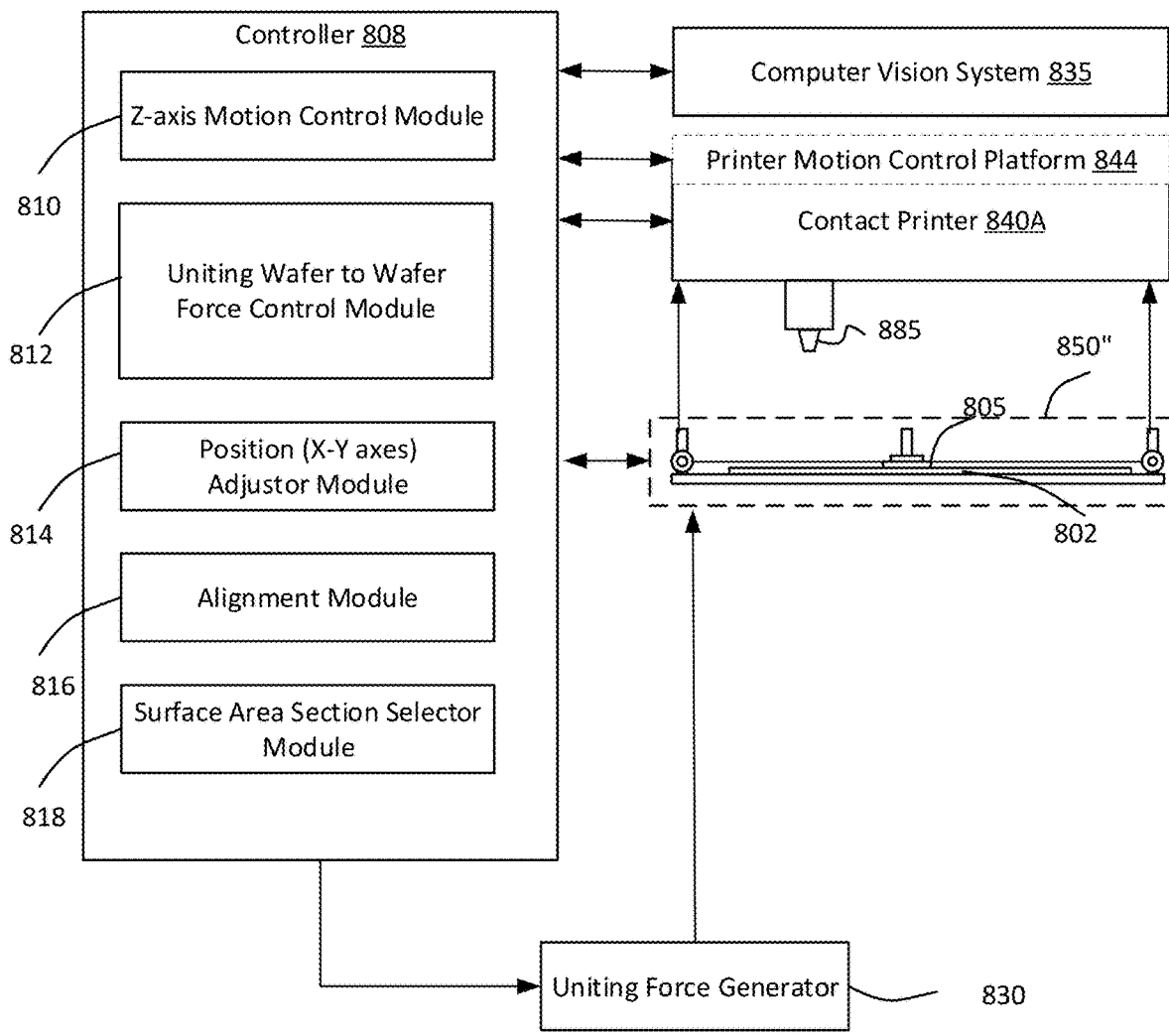

FIGS. 8A-8C illustrate a first LEECOPL system with contact-free positioning and alignment stage for a non-stationary wafer with the non-stationary wafer in different positions. The LEECOPL system 800A of FIG. 8A illustrates the mask wafer coupled to the wafer contact-free motion platform 850 in a first position. The LEECOPL system 800B of FIG. 8B illustrates the mask wafer moved by the wafer contact-free motion platform 850' to a second position different from the first position. The LEECOPL system 800C of FIG. 8C illustrates the mask wafer moved by the wafer contact-free motion platform 850" in a third position different from the first and second positions. The LEECOPL systems of FIGS. 8A-8C are essentially the same. Therefore, only one LEECOPL system 800A of FIG. 8A will be described in detail. The wafer contact-free motion platform 850 also refers to the wafer contact-free motion platforms 850' and 850".

Referring now to FIG. 8A, the LEECOPL system 800A may comprise a controller 808. The controller 808 will be described in more detail in relation to FIG. 12. The LEECOPL system 800A may include a Z-axis motion control module 810. The Z-axis motion control module 810 may be configured to position a non-stationary wafer (i.e., mask wafer 105) over a stationary wafer 802 (i.e., device pattern wafer 202) by a gap. The gap 803 is essentially the distance from the bottom surface of the non-stationary wafer 802 and the top surface of the stationary wafer 802. The LEECOPL system 800A may include a force control module 812 wherein after the mask (non-stationary) wafer 805 is positioned and aligned, the gap 803 may be removed so that the mask (non-stationary) wafer is placed on and in contact with the device pattern wafer 802. The force control module 812 may be configured to provide a control signal to the uniting force generator 830. The uniting force generator 830 may generate a suction force, an electro-static force, or the like to hold the stationary wafer and the non-stationary wafer together during the e-beam pattern writing process.

The uniting force generator 830 may cause the non-stationary wafer and the stationary wafer to unite such that there is no gap or substantially no gap between those layers of the non-stationary wafer and the stationary wafer which are in direct surface to surface contact.

Thereafter, the LEECOPL system 800A may perform contact printing as described in relation to the LEECOPL system 500 (FIG. 5C). In an example, the gap 803 is created by a wafer contact-free motion platform 850, represented as a dashed box, configured to provide for the separation and positioning of a mask (non-stationary) wafer 805 over a top surface of the stationary wafer 802 (i.e., device pattern wafer 202).

In the example, the wafer contact-free motion platform 850 will be described in more detail in relation to FIG. 9B. The wafer contact-free motion platform 850 shows the mask (non-stationary) wafer 805 at a first location with a gap 803. The wafer contact-free motion platform 850' of FIG. 8B represented as a dashed box, shows the mask (non-stationary) wafer 805 at a second location with a gap 803. The wafer contact-free motion platform 850" of FIG. 8C, represented as a dashed box, shows the mask (non-stationary) wafer 805 at the second location with a gap removed such that the mask (non-stationary) wafer 805 is essentially in contact with the stationary wafer 802 which corresponds to a third position.

The LEECOPL system 800A may include a contact-free position adjustor module 814, the position adjustor may adjust the location of the mask (non-stationary) wafer 805 in the X axis, the Y axis or a combination of both the X axis and the Y axis. The contact-free position adjustor module 814 may be synchronized with the Z-axis motion control module 810 so that, during the positioning phase, the gap 803 is created.

The LEECOPL system 800A may include an alignment module 816. The alignment module 816 may be configured to align the mask alignment marks 112a, 112b, 112c, and 112d of the mask wafer with alignment marks 214a, 214b, 214c, and 214d of a device pattern wafer 202 (i.e., stationary wafer 802) associated with the specific surface area section, as will be described in relation to FIG. 9B. During the positioning phase and the alignment phase the device pattern wafer 202 is stationary while the mask wafer is moved in accordance with the positioning and alignment.

The LEECOPL system 800A may include a computer vision system 835 including one or more cameras or video capture devices. The images from the computer vision system 835 may be processed by the alignment module 816 to cause the wafer contact-free motion platform 850 to navigate the non-stationary wafer (i.e., mask wafer 805) so that the alignment marks of the non-stationary wafer 505 (i.e., mask wafer 105) align with the alignment marks of the stationary wafer 802 (i.e., device pattern wafer 202). In some scenarios, the alignment module 816 may be part of the computer vision system 835 or separate. The alignment module 816 may include an optical alignment devices.

In some embodiments, computer vision system 835 may include a feature extractor to extract, by way of non-limiting example, alignment marks and/or other surface marks on a surface of a wafer, such as the stationary wafer and the non-stationary wafer. The feature extraction techniques may include pixel processing techniques and edge detection technique. Other feature extraction techniques to extract features from images may be used consistent with wafer design features. Machine learning may also be employed. The alignment module may guide the wafer contact-free motion platform 850 so that the marks align with confirmation of alignment verified using the computer vision.

The LEECOPL system 800A may include a surface area section selector 818. The stationary wafer 802 (i.e., device pattern wafer 202) may have a surface area which is subdivided into surface area sections configured to be printed thereon. The surface area section selector 818 will select the surface area section for which a template pattern is to be applied. Thereafter, the positioning phase and alignment phase may commence so that the mask wafer is positioned and aligned appropriately. In some embodiments, surface area sections may require a different pattern. Thus, system 800A may track the mask wafer to the template pattern so that correct pattern is applied to the corresponding surface area section.

The LEECOPL system 800A may include a contact printer 840A for low energy e-beam contact printing lithography. The LEECOPL system 800A may include a wafer contact-free motion platform 850 configured to build a barrier between the mask (non-stationary) wafer 805 and the stationary wafer 802 (i.e., device pattern wafer 202), such that the mask wafer is separated from and may be positioned over the device pattern wafer, by a gap, during the positioning and alignment phases while the device pattern wafer remains stationary.

The wafer contact-free motion platform 850 is configured to move the mask wafer 805 in a plurality of directions X, Y and/or Z. The lens 885 (i.e., lens 85) of the contact printer 840A may be aligned with the mask wafer 805. Any movement of the mask wafer 805 may require movement of the lens 885. Alternately, in lieu of the wafer contact-free motion platform 850 moving the mask wafer 805 in three directions X, Y and Z, the wafer contact-free motion platform 850 and the mask wafer 805 may be coupled to the contact printer 840A. The wafer contact-free motion platform 850 and the mask wafer 805 would move in unison with any movements of the contact printer 840A in at least one direction such as by a printer motion control platform 844. The wafer contact-free motion platform 850 would move the mask wafer 805 in those directions not controlled by the movements of the contact printer 840A. Printer motion control platforms 844 are known in the art and may include rails system and motor controlled components configured to be move the printer or optics of the printer in certain directions. The motion of the printer motion control platform 844 would also be controlled by controller 808.

The modules 810, 812, 814, 816, 818 may be implemented using hardware, software, firmware or a combination of hardware, software and firmware. For instance, the modules may be implemented as part of a microcontroller. The modules may include one or more of a register or data store for temporarily storing data, a comparator for comparing data, programmed circuitry for performing one or more motion control operations and/or the like. The modules may receive data pertaining to one or more functions executed by a subsystem, and may use this information to verify at least a portion of the execution flow to which the function(s) pertain as explained in more detail below. The modules 810, 814 and 816 may determine the amount and direction of movement the bearing assemblies of the wafer contact-free motion platform 850 require to move the non-stationary wafer. The modules 810, 814 and/or 816 generate control signals to cause the bearing assemblies to move the non-stationary wafer, accordingly. The modules 810, 814 and/or 816 may generate control signals to cause the printer motion control platform 844 to move.

Figure 11B:
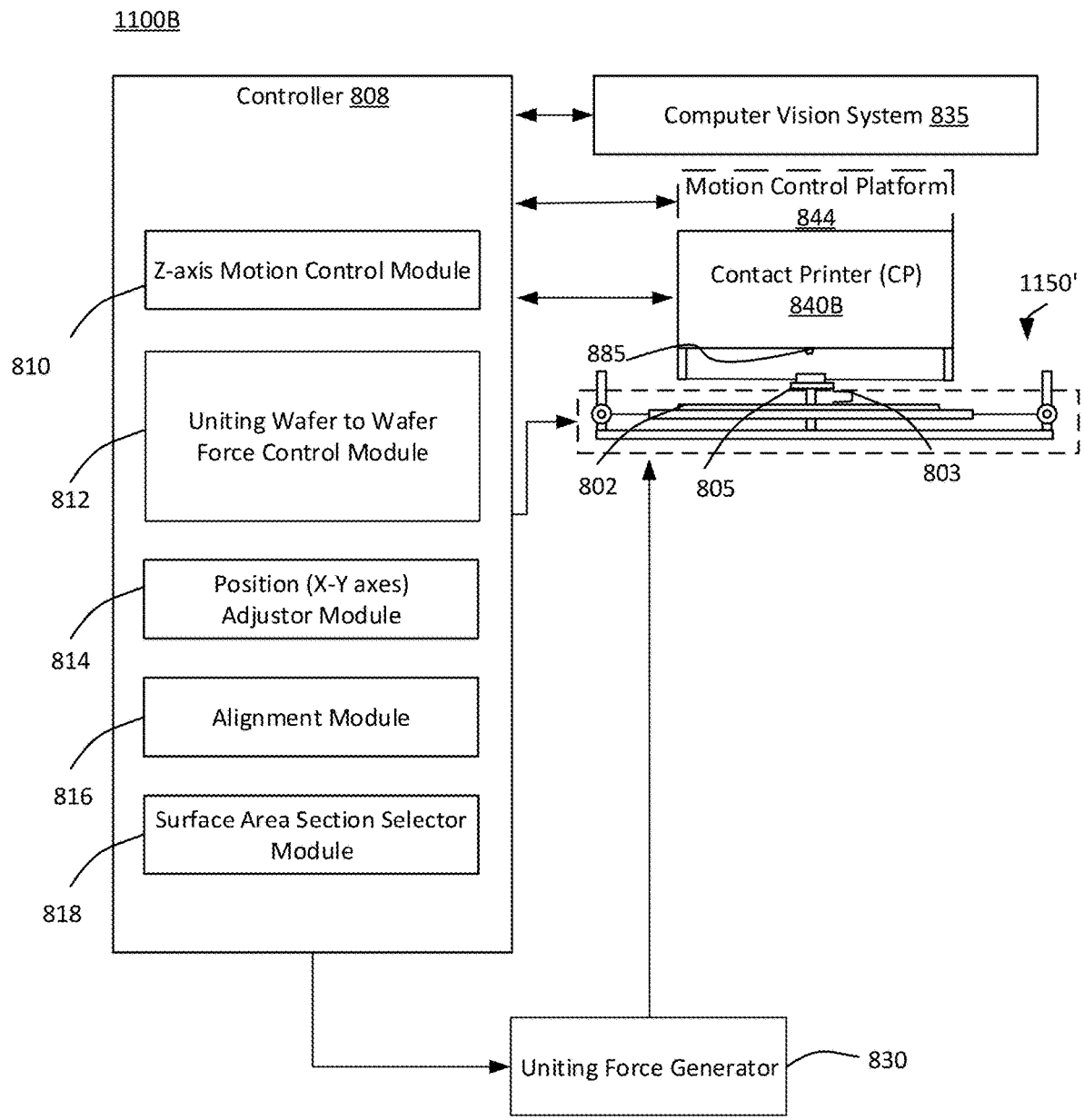
Figure 11C:
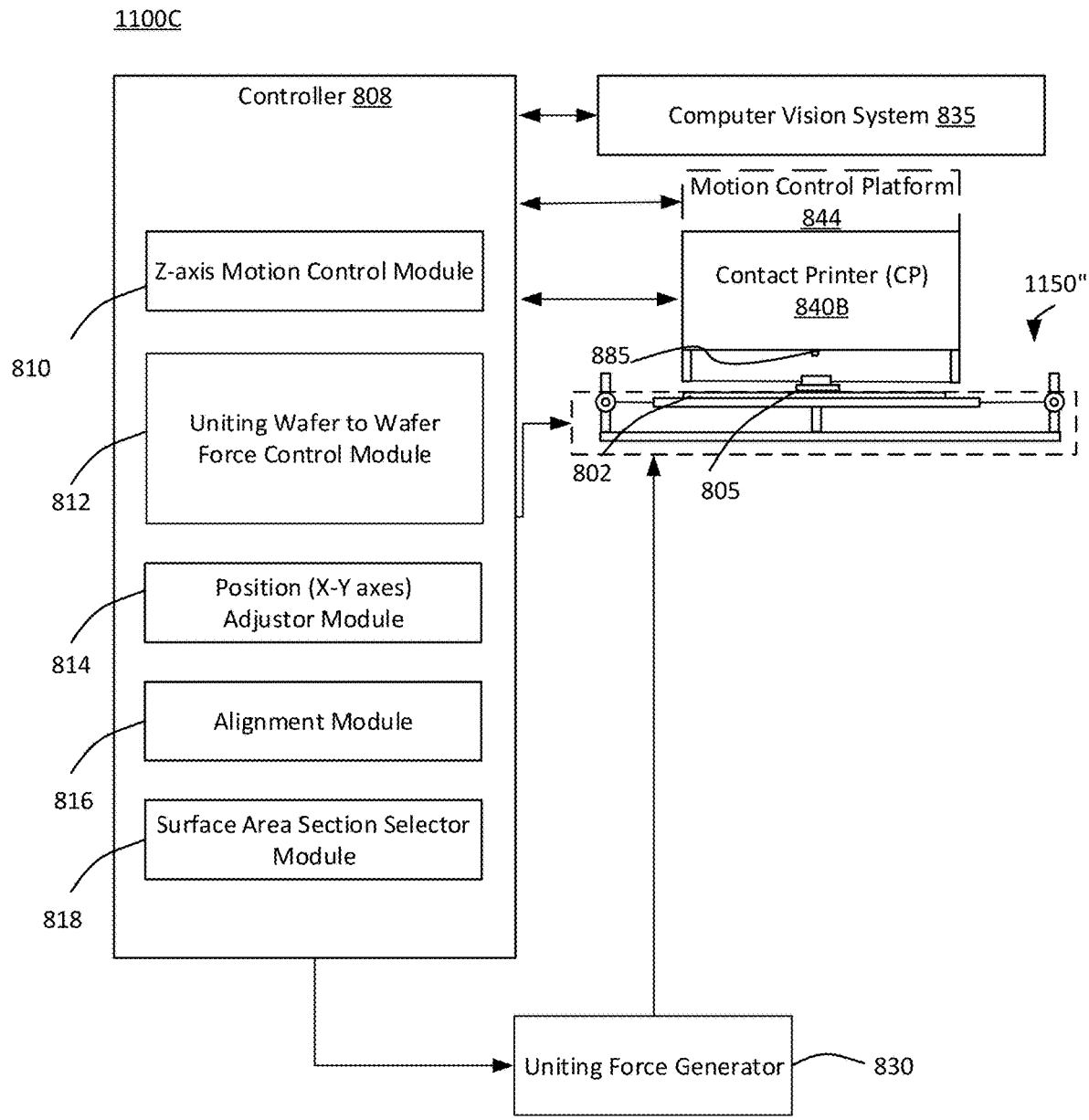

FIGS. 11A-11C illustrate a second LEECOPL system with contact-free positioning and alignment stage for a non-stationary wafer with the non-stationary wafer in different positions. The LEECOPL system 1100A of FIG. 11A illustrates the device pattern wafer 802 coupled to the wafer contact-free motion platform 1150 in a first position. The LEECOPL system 1100B of FIG. 11B illustrates the device pattern wafer 802 moved by the wafer contact-free motion platform 1150' to a second position different from the first position. The LEECOPL system 1100C of FIG. 11C illustrates the device pattern wafer 802 moved by the wafer contact-free motion platform 1150" in a third position different from the first and second positions. The LEECOPL systems of FIGS. 11A-11C are essentially the same. Therefore, only one LEECOPL system 1100A of FIG. 11A will be described in detail. The wafer contact-free motion platform 1150 also refers to the wafer contact-free motion platforms 1150' and 1150".

Referring now to FIG. 11A, the LEECOPL system 1100A may comprise a controller 808 as will be described in more detail in relation to FIG. 12. The LEECOPL system 1100A is similar to the LEECOPL system 800A except the stationary wafer and non-stationary wafer are reversed. Accordingly, the motion control of one or both of the contact printer 840B and the wafer contact-free motion platform 1150 may be different than the contract printer and wafer contact-free motion platform of FIGS. 8A-8C. In FIG. 11A, the wafer contact-free motion platform 1150 controls the motion of the device pattern wafer 802. Thus, the non-stationary wafer is the device pattern wafer 802 and the mask wafer 805 is generally the stationary wafer. For example, the contact printer 840B may move via the printer motion control platform 844 relative to the non-stationary wafer (i.e., device pattern wafer 802). However, the mask wafer is the stationary wafer and may be essentially fixed relative to the contact printer 840B. In other words, the mask wafer is not independently moved during the contact-free positioning and alignment phases for aligning a surface area sections of the non-stationary wafer before printing.

The LEECOPL system 1100A may perform contact printing as described in relation to the LEECOPL system 500 (FIG. 5C). In an example, the gap 803 is created by a wafer contact-free motion platform 1150. The platform 1150 is configured to provide for the separation and contact-free motion of a non-stationary wafer (i.e., device pattern wafer 802) under a bottom or lower surface of the stationary wafer (i.e., mask wafer 805).

The wafer contact-free motion platform 1150 shows the device pattern wafer 802 at a first location with a gap 803 therebetween. The platform 1150 has the position of the device pattern wafer 802 generally offset in at least one of the X direction or Y direction relative to the illustrated position of the mask wafer 805. Furthermore, the platform 1100A has the device pattern wafer 802 positioned in the Z-axis so that a gap exists during contact-free positioning and alignment phases.

The wafer contact-free motion platform 1150' of FIG. 11B shows the device pattern wafer 802 at a second location with the gap between the top surface of the device pattern wafer 802 (i.e., non-stationary wafer) and the mask wafer 805 (i.e., stationary wafer). Assume, that the second location corresponds to a selected surface area section selected by the selector module 818. The wafer contact-free motion platform 1150" of FIG. 11C shows the gap removed between the top surface of the device pattern wafer 802 and the bottom surface of the mask wafer 805 and the device pattern wafer 802 shown in a third location. The mask wafer 805 may be essentially in contact with the device pattern wafer 802 after the gap is removed. However, in some embodiments, the uniting force generator 830 may cause a uniting force to be applied to one or both of the device pattern wafer 802 (i.e., non-stationary wafer) and the mask wafer 805 (i.e., stationary wafer) to cause the non-stationary wafer and stationary wafer to unite.

In the embodiment of 1100A, the wafer contact-free motion platform 1150 may be configured to move the device pattern wafer 802 in three directions X, Y and Z. The lens 885 (i.e., lens 85) of the contact printer 840B may be aligned with the mask wafer 805. Accordingly, any movement of the mask wafer 805 may require movement of the lens 885. The wafer contact-free motion platform 1150 may move the device pattern wafer 802 to align with the lens 885.

Figure 9A:
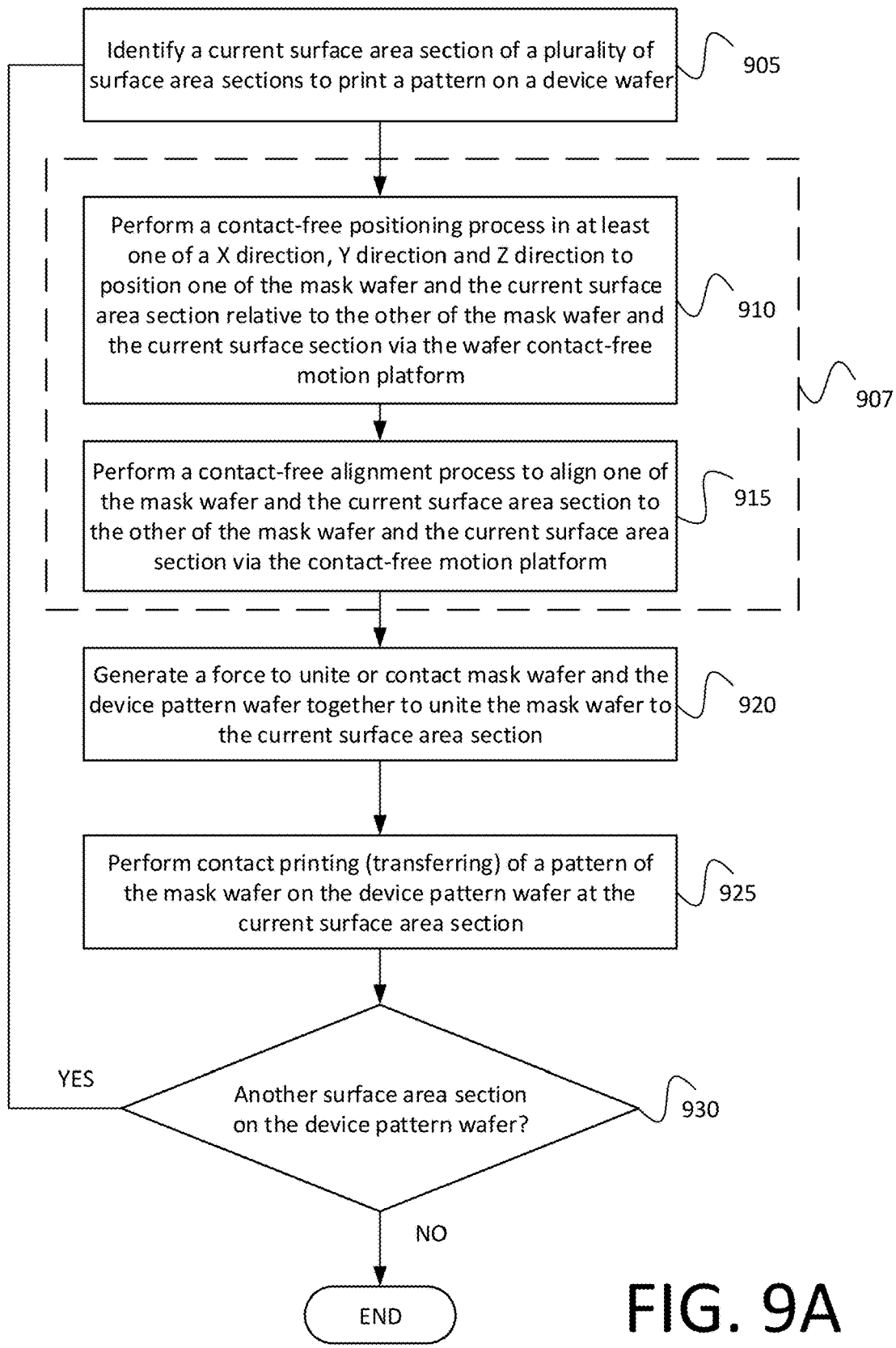
FIG. 9A illustrates a flowchart of a sliding and contact-free contact printing method.
Figure 9B:
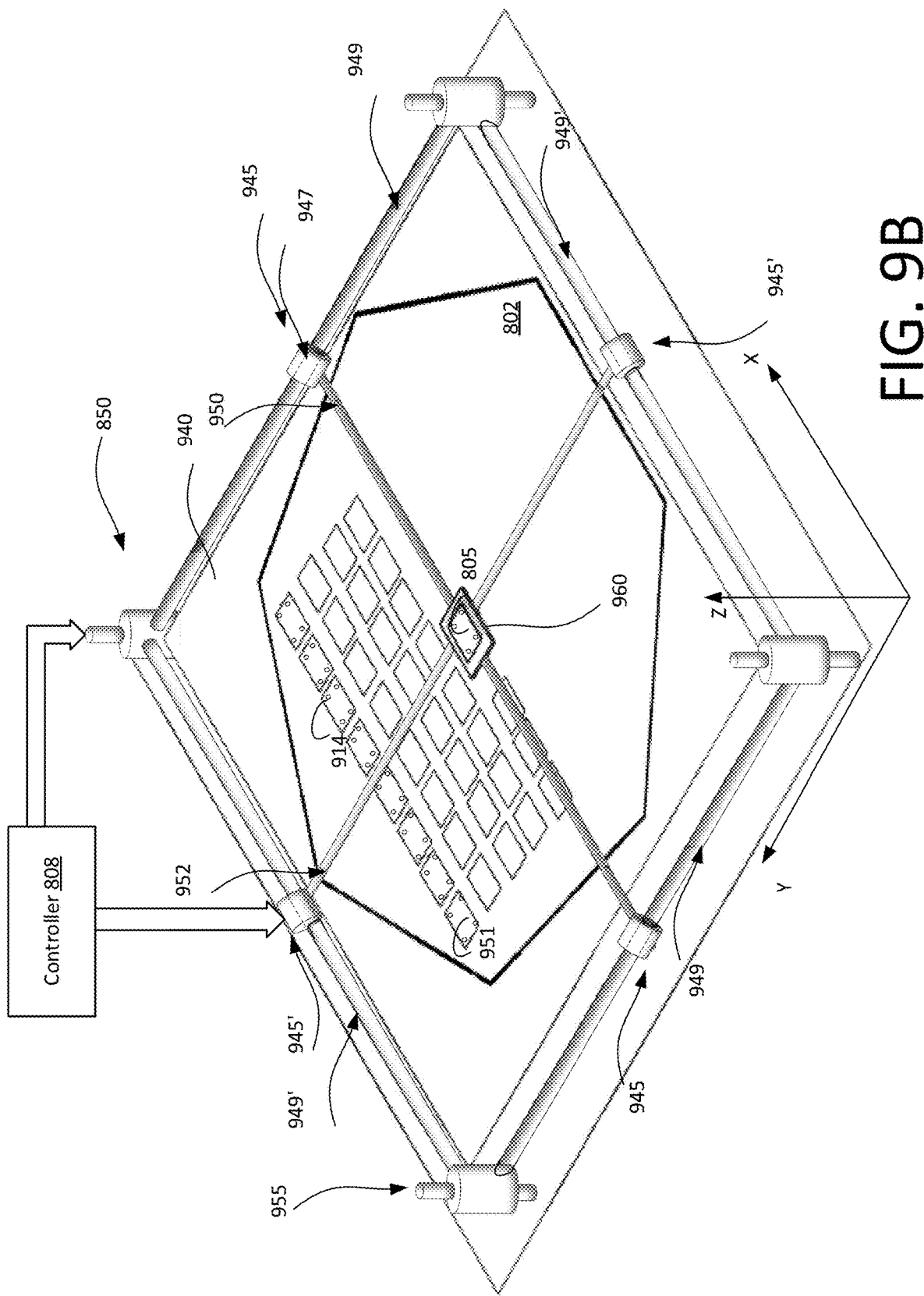
FIG. 9B illustrates a block diagram of a mask wafer contact-free motion platform with a device pattern wafer with a plurality of surface area sections and mask wafer.

FIG. 9A illustrates a flowchart of a sliding and contact printing (S&CP) method 900. The method 900 includes a plurality of blocks or steps which may be performed in the order shown, a different order or one or more blocks may be performed contemporaneously. The method 900 may include additional blocks or one or more blocks may be omitted. One or more of the method steps or blocks of FIG. 9A may be performed under the control of the controller 808 by programming instructions stored in a computer readable medium which when executed causes one or more processors to perform the method 900. The controller 808 interfaces with the platform 850, the printer 840A, computer vision system 835, the printer motion control platform 844 and force generator 830 to co-locate the non-stationary wafer to a region of interest on the stationary wafer, align the wafers, unite the wafers and cause the printer to transfer the mask to the stationary wafer.

The S&CP method 900 will be described in combination with FIG. 9B and FIG. 10. FIG. 9B illustrates a block diagram of a wafer contact-free motion platform 850 with a device pattern wafer 802 having a plurality of surface area sections 951. While the illustration shows 35 surface area sections, the device pattern wafer 802 may have any number of surface area sections that need lithography. In some embodiments, the entire surface area of the device pattern wafer 802 may need lithography, such that the entire surface area is divided into surface area sections. In other embodiments, only portions of surface area of the device pattern wafer 802 need lithography. The number of sections may be limited by the size of the device pattern wafer 802 relative to the mask wafer 805.

Each surface area section 951 is shown with one or more alignment marks 914 (i.e., alignment marks 214a-214d) on the device pattern wafer 802 for alignment with the mask wafer 805. For the sake of brevity, the marks 914 are represented as circles. The mask wafer 805 includes a pattern of circles to match the marks 914. Each surface area section 951, in response to being selected, may become a region of interest (ROI) for each iteration of contact printing such that one or more of the ROIs may require a different template pattern printed thereon relative to the pattern applied on any one of the other ROIs.

The wafer contact-free motion platform 850 may comprise a platform substrate 940 having a planar surface for placement of the device pattern wafer 802, for example. The wafer contact-free motion platform 850 may include one or more air bearing assemblies 945, 945' and a wafer support system 950, 952 operatively connected to the air bearing assemblies 945, 945'. A longitudinal axis of each of the cross bars of the wafer support system 950, 952 intersect with each other at a wafer support platform 960.

The wafer support system 950, 952 may have operatively connected thereto a wafer support platform 960 so as to move the mask wafer 805 to a determined surface area section 951. The air bearing assemblies 945, 945' may include air bearings 947 operatively connected to travel along a longitudinal axis of longitudinal rails 949, 949', for example. The air bearing assemblies may operate with friction-free movements.

In the example, a first pair of the air bearings assemblies 945 may be operatively connected to the cross bars of the wafer support system 950, 952 which intersect with each other at the wafer support platform 960 to move the wafer support platform 960 in a Y direction, along longitudinal rails 949 via air bearings 947. In the example, a second pair of the air bearing assemblies 945' may be operatively connected to the cross bars of the wafer support system 950, 952 which intersect with each other at the wafer support platform 960 to move the wafer support platform 960 in an X direction along longitudinal rails 949' via air bearings 947.

In the example, the wafer support platform 960 may slide along the longitudinal axes of the cross bars of the wafer support system 950, 952 as the air bearings 947 move in one of the X direction or the Y direction.

The wafer support platform 960 may include a seat or bed for the placement and support of the mask wafer 805 above the device pattern wafer 802. The wafer support system 950, 952 may include cross bars which intersect with each other at the wafer support platform 960.

The wafer contact-free motion platform 850 may include one or more air bearing assemblies 955 coupled to longitudinal rails 949, 949'. The one or more air bearing assemblies 955 may be configured to move in unison to raise or lower in the Z direction the wafer support platform 960 by raising or lowering the longitudinal rails 949, 949' and air bearings 947. The air bearing assemblies 955 include a longitudinal axis which is generally perpendicular to the longitudinal axes of the cross bars of the wafer support system 950, 952 and longitudinal rails 949, 949'. In an example, the wafer support platform 960 may be controlled to move with the air bearing assemblies 955 so that the gap 803 varies (decreases) as the wafer support platform 960 is lowered in the direction Z toward the device pattern wafer 802. In an example, the wafer support platform 960 may be controlled to move with the one or more air bearing assemblies 955 so that the gap 803 varies (increases) as the wafer support platform 960 is raised in the direction Z away from the device pattern wafer 802.

The wafer contact-free motion platform 850 is controlled by the controller 808 to position the mask wafer 805 to a respective one surface area section 951, align the mask wafer 805 with the respective one surface area section 951, and bring the mask wafer 805 in contact with the respective one surface area section 951. Thereafter, the contract printing may commence, as controlled by the controller 808. After printing is complete, the wafer contact-free motion platform 850 is controlled by the controller 808 to raise the mask wafer 805 above the respective one surface area section 951 and position the mask wafer 805 to the next surface area section. The platform 850 may be configured to apply a suction force to unite the mask wafer 805 and the device pattern wafer 802 in some scenarios. The platform 1150 may also include air-bearing assemblies, motors and other motion control systems to perform the functions described herein.

Figure 10:
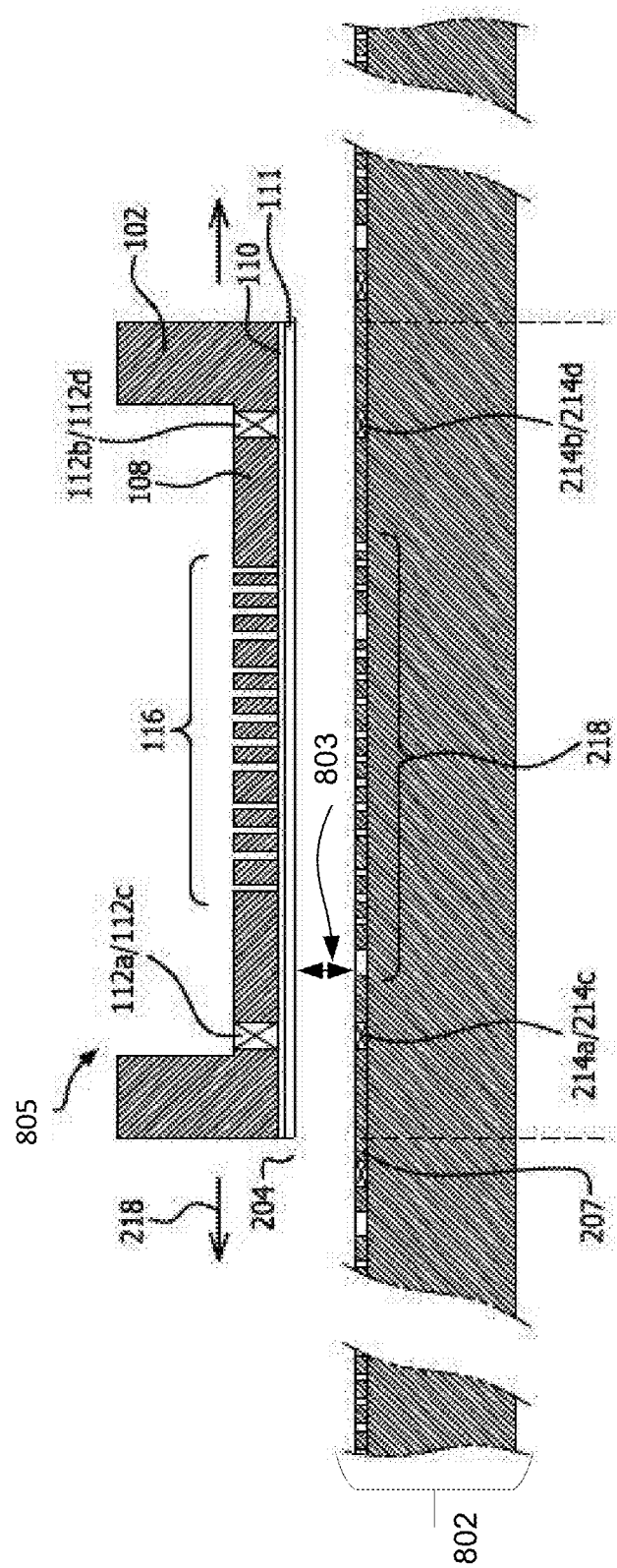
FIG. 10 illustrates a side view of the mask and device wafer of the sliding and contact-free positioning process.

FIG. 10 illustrates a side view of the mask wafer and device pattern wafer during the sliding and contact-free positioning process. The mask wafer 805 (i.e., mask wafer 105) may be similar to the mask wafer 105 of FIGS. 3A and 4. Thus, like reference numerals will not be described further. Additionally, the device pattern wafer 802 may be similar to the device pattern wafer 202 in FIG. 4, for example. Again, like reference numerals will not be describe further. In FIG. 10, the mask wafer 805 is illustrated positioned at a distance above the device pattern wafer 802 by virtue of support of the mask wafer 805 by the wafer contact-free motion platform 850 (FIG. 9B) above the device pattern wafer 802. Alternately, in FIG. 10, the mask wafer 805 may be fixed or stationary at a location above the device pattern wafer 802 and the device pattern wafer 802 may be moved below the mask wafer 805 by the wafer contact-free motion platform 1150 to raise the device pattern wafer 802 to the mask wafer 805. The layer 110 may be a semitransparent layer which supports donut-shaped patterns. The donut-shaped pattern does not limit the shape to a mainly round pattern.

Returning again to FIG. 9A, the S&CP method 900 provides for sliding and contact printing lithography wherein the positioning and aligning are performed contact-free and the transferring is performed using contact printing. At block 905, the S&CP method 900 may include identifying a current surface area section or ROI of a plurality of surface area sections 951 to print a pattern on the device pattern wafer 802 at the current surface area section. Each ROI may be registered by location relative to the dimensions of the device pattern wafer 802. Block 907 of the method 900 provides for contact-free co-locating of one of the mask wafer 805 and the current surface area of the device pattern wafer 802 relative to the other via a wafer contact-free motion platform (i.e., platform 850 or 1150). For example, if the mask wafer 805 is generally stationary, the device pattern wafer 802 would be co-located generally with the mask wafer 805.

At block 910, the S&CP method 900 may include performing a contact-free positioning process configured to position one of the mask wafer 805 and the current surface area section of the device pattern wafer 802 relative to the other via the wafer contact-free motion platform (i.e., platform 850 or 1150). The positioning may require movement of the stationary wafer in one of the X direction, Y direction, Z direction or a combination of two or more of the X direction, Y direction and Z direction. At block 915, the S&CP method 900 may include performing a contact-free alignment process to align the mask wafer 805 and the current surface area section of the device pattern wafer 802 via the wafer contact-free motion platform (i.e., platform 850 or 1150). At block 920, the S&CP method 900 may generate a force to unite or contact the mask wafer 805 with the current surface area section of the device pattern wafer 802.

In some embodiments, the terms "contact-free" includes no surface to surface contact between adjacent and/or directly opposing layers of two wafer substrates during co-locating, positioning, sliding and alignment.

At block 925, the S&CP method 900 may include performing contact printing (transferring) by the contact printer 840A or 840B of a pattern associated with the mask wafer onto the device pattern wafer at the current surface area section. Once the mask wafer 805 is contacted, the exposure may be performed to effectuate contact printing of one pattern to the current surface area section of a plurality of surface areas sections 951.

At block 930, the S&CP method 900 may include determining whether there is another surface area section on the device pattern wafer 802 that needs a pattern printed or transferred thereon. If the determination is "YES," the method may return to block 905 to identify the next surface area section or ROI. However, if the determination is "NO," the method 900 may end. The blocks 905, 907, 920, 925 and 930 may be repeated until all device patterns are printed on the whole surface area of the device pattern wafer 802.

In some embodiments, one or more mask wafers 805 may be used to complete the transfer of one or more patterns to the device pattern mask 802. For example, each mask wafer may have a different template pattern.

The contact-free co-locating process 907 may include one or more of sliding horizontally in an X direction or Y direction, up-down motion vertically in a Z direction, step motion horizontally or vertically and alignment motion. The term "co-locating" as used herein co-locates a template pattern on a mask wafer with a surface area section of the device pattern wafer to which the template pattern is to be transferred. One or more of the method steps or blocks of FIG. 9A may be performed under the control of controller 808 by programming instructions stored in a computer readable medium which when executed causes one or more processors to perform the process 900.

The positioning may include generating a gap 803 (FIG. 10). By way of non-limiting example, the gap may have a distance of about a 20 nanometer to 100 nanometers. Of course, a smaller or larger gap distance may be used.

Specifically, since the mask wafer is much smaller than the device wafer, the up-down motion, the step motion, and/or the alignment movement may be done by the mask wafer alone while the device wafer remains stationary. Consequently, the mask wafer and the e-beam optics should remain essentially aligned or be re-aligned prior to actual application of the e-beam to perform printing on the device wafer. By way of non-limiting example, the mask may have a diameter of approximately 2 centimeters (cm) and the device wafer may have a diameter of approximately 30 cm.

The device pattern wafer 802 comprises a semiconductor wafer, a first intermediate layer (i.e., the third layer) formed on the semiconductor wafer, and a second intermediate layer (i.e., fourth layer) formed on the first intermediate layer. The template device pattern is transferred onto the first intermediate layer.

The systems described herein can comprise one or more components such as a processor, an application specific circuit, a programmable logic device, a digital signal processor, or other circuit programmed to perform the functions described herein. The system can be realized in one computer system or several interconnected computer systems. Any kind of computer system or other apparatus adapted for carrying out the methods described herein is suited. A typical combination of hardware and software can be a general-purpose computer system. The general-purpose computer system can have a computer program that can control the computer system such that it carries out the methods described herein.

Computer systems (i.e., controller 808) as referenced herein can comprise various types of computing systems and devices, including a server computer, a personal computer (PC), a laptop computer, a desktop computer, a network router, switch or bridge, or any other device capable of executing a set of instructions (sequential or otherwise) that specifies actions to be taken by that device.

Figure 12:
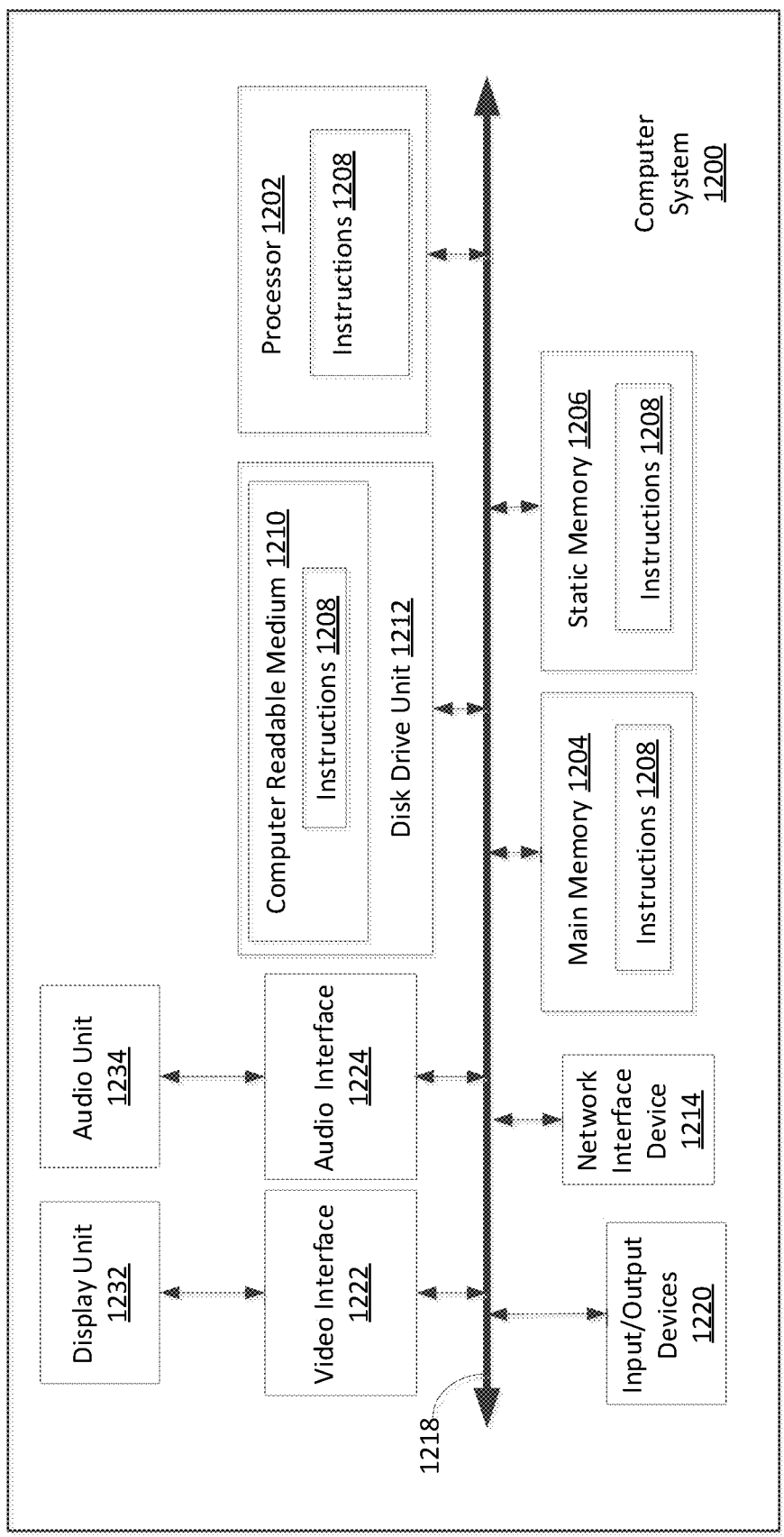
FIG. 12 illustrates a hardware block diagram comprising an exemplary computer system.

Referring now to FIG. 12, there is shown a hardware block diagram comprising an exemplary computer system 1200 (i.e., controller 808). The machine can include a set of instructions 1208 which are used to cause the computer system to perform any one or more of the methodologies discussed herein. In a networked deployment, the machine can function as a server or a router. In one or more scenarios, the exemplary computer system 1200 can correspond to each of the controllers 808. In some scenarios, the computer 1200 can operate independently as a standalone device. However, the disclosure is not limited in this regard and in other scenarios the computer system can be operatively connected (networked) to other machines in a distributed environment to facilitate certain operations described herein. Accordingly, while only a single machine is illustrated it should be understood that in other scenarios the system can be taken to involve any collection of machines that individually or jointly execute one or more sets of instructions as described herein.

The computer system 1200 is comprised of a processor 1202 (e.g. a central processing unit or CPU), a main memory 1204, a static memory 1206, a drive unit 1212 for mass data storage and comprised of machine readable media 1210, input/output devices 1220, a display unit 1232 (e.g. a liquid crystal display (LCD), a solid state display, or a cathode ray tube (CRT)), and a network interface device 1214. Communications among these various components can be facilitated by means of a data bus 1218. One or more sets of instructions 1208 can be stored completely or partially in one or more of the main memory 1204, static memory 1206, and drive unit 1212. The instructions can also reside within the processor 1202 during execution thereof by the computer system. The input/output devices 1220 can include a keyboard, a mouse, a multi-touch surface (e.g. a touchscreen) and so on. The network interface device 1214 can be comprised of hardware components and software or firmware to facilitate wired or wireless network data communications in accordance with a network communication protocol utilized by a data network. The touchscreen may be part of a display unit 1232 connected to the bus 1218 via a video interface 1222. An audio unit 1234 (e.g., speaker) may be connected to the bus 1218 via an audio interface 1224.

The drive unit 1212 can comprise a machine readable medium 1210 on which is stored one or more sets of instructions 1208 (e.g. software) which are used to facilitate one or more of the methodologies and functions described herein. The term "machine-readable medium" shall be understood to include any tangible medium that is capable of storing instructions or data structures which facilitate any one or more of the methodologies of the present disclosure. Exemplary machine-readable media can include magnetic media, solid-state memories, optical-media and so on. More particularly, tangible media as described herein can include; magnetic disks; magneto-optical disks; CD-ROM disks and DVD-ROM disks, semiconductor memory devices, electrically erasable programmable read-only memory (EEPROM)) and flash memory devices. A tangible medium as described herein is one that is non-transitory insofar as it does not involve a propagating signal.

Computer system 1200 should be understood to be one possible example of a computer system which can be used in connection with the various implementations disclosed herein. However, the systems and methods disclosed herein are not limited in this regard and any other suitable computer system architecture can also be used without limitation. Dedicated hardware implementations including, but not limited to, application-specific integrated circuits, programmable logic arrays, and other hardware devices can likewise be constructed to implement the methods described herein. Applications that can include the apparatus and systems broadly include a variety of electronic and computer systems. In some scenarios, certain functions can be implemented in two or more specific interconnected hardware modules or devices with related control and data signals communicated between and through the modules, or as portions of an application-specific integrated circuit. Thus, the exemplary system is applicable to software, firmware, and hardware implementations.

Further, it should be understood that embodiments can take the form of a computer program product on a tangible computer-usable storage medium (for example, a hard disk or a CD-ROM). The computer-usable storage medium can have computer-usable program code embodied in the medium. The term computer program product, as used herein, refers to a device comprised of all the features enabling the implementation of the methods described herein. Computer program, software application, computer software routine, and/or other variants of these terms, in the present context, mean any expression, in any language, code, or notation, of a set of instructions intended to cause a system having an information processing capability to perform a particular function either directly or after either or both of the following: a) conversion to another language, code, or notation; or b) reproduction in a different material form.

Figure 13:
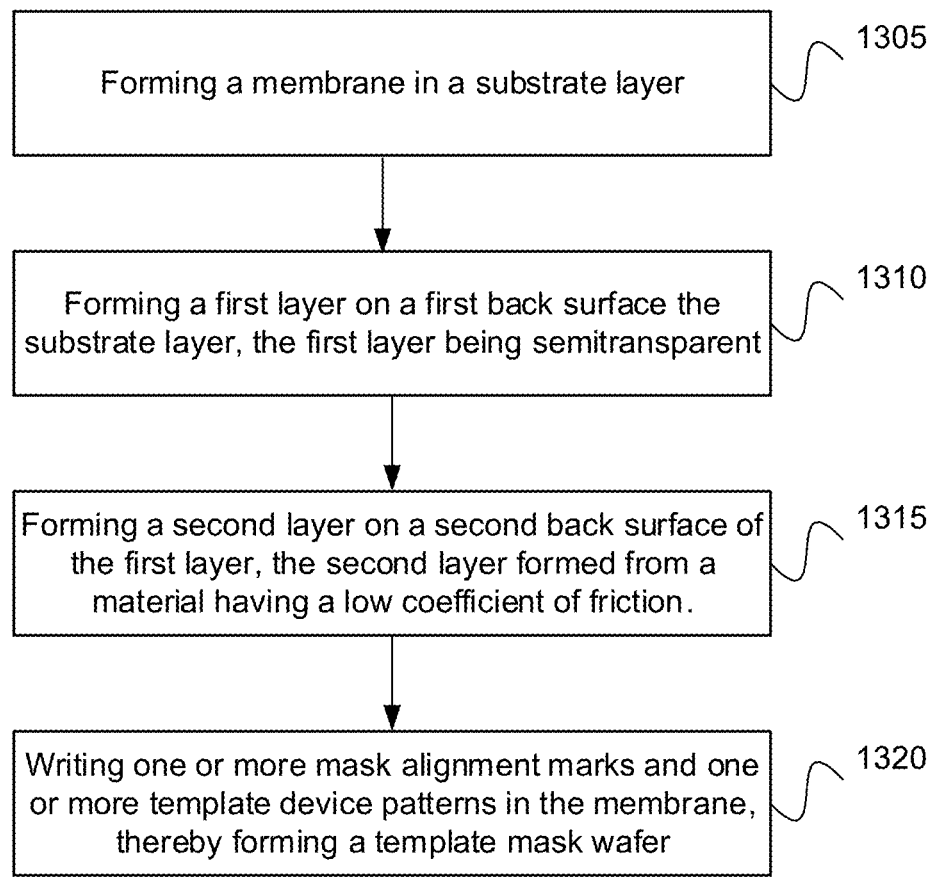
FIG. 13 illustrates a flowchart of a method for forming a template mask wafer.

FIG. 13 illustrates a flowchart of a method 1300 for forming a template mask wafer 105 (FIG. 3A) and will be described in relation with FIGS. 1-3C. The method 1300 may include, at block 1305, forming a membrane in a substrate layer; at block 1310, forming a first layer on a first back surface the substrate layer, the first layer being semi-transparent; at block 1315, forming a second layer on a second back surface of the first layer, the second layer formed from a material having a low coefficient of friction; and at block 1320, writing one or more mask alignment marks and one or more template device patterns in the membrane, thereby forming a template mask wafer 105.

Figure 14:
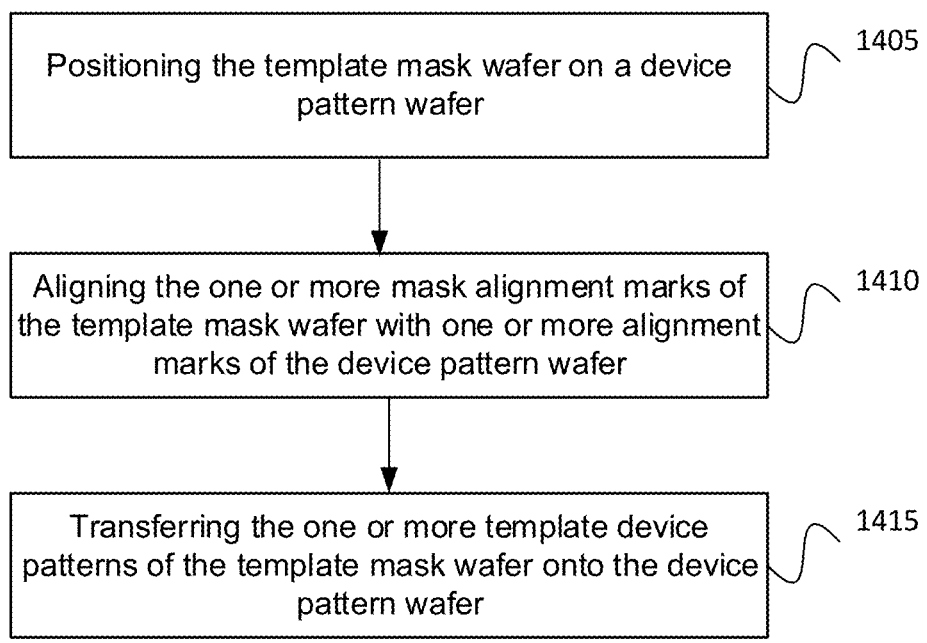
FIG. 14 illustrates a flowchart of a method for contact printing using a mask wafer.

FIG. 14 is a flowchart of a method 1400 for contact printing using a mask wafer as formed herein to apply a template pattern to a device pattern wafer 202. The method 1400 may include, at block 1405, positioning the template mask wafer on a device pattern wafer; at block 1410, aligning the one or more mask alignment marks of the template mask wafer with one or more alignment marks of the device pattern wafer; and at block 1415, transferring the one or more template device patterns of the template mask wafer onto the device pattern wafer.

As used herein, the term "about" in reference to a numerical value means plus or minus 10% of the numerical value of the number with which it is being used.

The description of the embodiments of the present disclosure has been presented for purposes of illustration and description, but is not intended to be exhaustive or limited to the embodiments in the form disclosed. Many modifications and variations will be apparent to those of ordinary skill in the art without departing from the scope and spirit of the disclosure. The embodiments and examples were chosen and described in order to best explain the principles of the disclosure and the practical application, and to enable others of ordinary skill in the art to understand the disclosure for various embodiments with various modifications as are suited to the particular use contemplated.

It will be clear that the various features of the foregoing systems and/or methodologies may be combined in any way, creating a plurality of combinations from the descriptions presented above.

What is claimed is:

1. A method, comprising:
    positioning a template mask wafer having a template device pattern relative to a predetermined surface area section of a device wafer;
    aligning one or more mask alignment marks of the template mask wafer with one or more alignment marks of the device wafer;
    contacting the mask wafer on the device wafer; and
    during the contacting, using an electron beam in an electron beam projection process to transfer a template device pattern of the template mask wafer onto the predetermined surface area section of the device wafer;
    wherein the electron beam is transmitted through a semi-transparent layer of the template mask wafer, and the template mask wafer is spaced apart from the device wafer throughout the positioning and aligning.

2. The method of claim 1, further comprising uniting the mask wafer and the device wafer with a force.

3. The method of claim 1, further comprising performing the following operations prior to the positioning:
    maintaining the template mask wafer stationary;
    generating a gap between the template mask wafer and the device wafer; and
    after aligning, removing the gap between the template mask wafer and the device wafer.

4. The method of claim 1, wherein the positioning further comprises motion of one of the mask wafer and the device wafer.

5. The method of claim 4, wherein the motion comprises sliding one of the mask wafer and the device wafer to co-locate the mask wafer with the predetermined surface area section.

6. The method of claim 1, wherein:
    the template device pattern comprises a donut-shaped pattern; and
    the semitransparent layer of the template mask wafer is used to support center portion of the donut-shaped pattern.

7. A method, comprising:
    positioning a template mask wafer having a template device pattern relative to a predetermined surface area section of a semiconductor device wafer (SDW) having a first intermediate layer;
    aligning one or more mask alignment marks of the template mask wafer with one or more alignment marks of the SDW;
    contacting the mask wafer on the SDW; and
    using an electron beam in an electron beam projection process to transfer the template device pattern onto the first intermediate layer in the predetermined surface area section;
    wherein the electron beam is transmitted through a semi-transparent layer of the template mask wafer, and the template mask wafer is spaced apart from the SDW throughout the positioning and aligning.

8. The method of claim 7, wherein transferring of the template device pattern to the first intermediate layer comprises exposing the template mask wafer and the SDW to the electron beam.

9. A system comprising:
    a motion platform;
    a processor coupled to the motion platform, the processor configured to:
        control the motion platform to cause positioning of a template mask wafer having a template device pattern relative to a predetermined surface area section of a device wafer,
        control the motion platform to cause aligning of one or more mask alignment marks of the template mask wafer with one or more alignment marks of the device wafer,
        control the motion platform to cause contacting of the mask wafer with the device wafer;
        control an electron beam in an electron beam projection process to facilitate transfer of a template device pattern of the template mask wafer onto the predetermined surface area section of the device wafer concurrent with the contacting; and the template mask wafer includes a semi-transparent layer through which the electron beam is transmitted during the electron beam projection process;
wherein the processor is configured to control the motion platform so that the template mask wafer is spaced apart from the device wafer throughout the positioning and aligning.

10. The system of claim 9, wherein the motion platform includes air-bearing assemblies.

11. The system of claim 9, wherein the processor is further configured to perform the following operations prior to the positioning:
control the motion platform to cause generation of a gap between the template mask wafer and the device wafer; and
after aligning, control the motion platform to cause removing of the gap between the template mask wafer and the device wafer.

12. The system of claim 9, wherein the processor is further configured to control the motion platform to cause a motion of the one of the mask wafer and the device pattern wafer.

13. The system of claim 12, wherein the processor is further configured to control the motion platform to cause sliding of one of the mask wafer and the device wafer.

14. The system of claim 9, wherein:
the template device pattern comprises a donut-shaped pattern; and
the semi-transparent layer of the template mask wafer is configured to support a center of the donut-shaped pattern.

15. The system of claim 9, wherein:
the device wafer comprises a semiconductor wafer which includes a first intermediate layer disposed on a second intermediate layer, the second intermediate layer being disposed on a surface of the semiconductor wafer, and
wherein the system is configured to cause the template device pattern to be transferred onto the first intermediate layer during the electron beam projection process.

16. The system of claim 15, wherein the system is configured to transfer the template device pattern onto the first intermediate layer via the electron-beam projection process, and wherein the system is configured to minimize the occurrence of beam-blur as the electron beam passes through the template mask wafer as a result of the contact between the mask wafer and the device wafer during the electron-beam projection process.

17. The system of claim 16, wherein the processor is further configured to cause exposing the template mask wafer and the device wafer to the electron beam.

18. A method, comprising:
positioning relative to a predetermined surface area section of a device wafer a template mask wafer having a template device pattern;
aligning one or more mask alignment marks of the template mask wafer with one or more alignment marks of the device wafer;
using an electron beam in an electron beam projection process to transfer a template device pattern of the template mask wafer onto the predetermined surface area section of the device wafer; and
controlling a position of the template mask wafer relative to the device wafer so that the template mask wafer contacts the device wafer during the electron beam projection process, whereby a blurring of the electron beam passing through the template mask wafer is negligibly small.

19. The method according to claim 18, further comprising controlling a position of the template mask wafer relative to the device wafer so that the template mask wafer is spaced apart from the device wafer throughout the positioning and aligning.

20. The method according to claim 18, wherein the contact between the template mask wafer and the device wafer results in a single thermally combined body in which thermal energy is distributed.

21. The method according to claim 18, further comprising supporting a portion of one or more patterns in the template mask wafer exclusively using a semi-transparent layer of the template mask wafer.

22. The method according to claim 20, selecting a material of the semi-transparent layer so that only a negligible amount of beam scatter is caused as the electron beam passes through the semi-transparent layer.

23. The method according to claim 22, wherein the negligible amount of beam scatter is limited to about one percent.

24. The method according to claim 22, wherein the material is selected from the group consisting of amorphous carbon, a diamond film, and a doped Si material.

25. The method according to claim 20, wherein the one or more patterns comprise at least one donut-shaped pattern.

26. The method according to claim 24 wherein the donut-shaped pattern is selected to include one or more of a round pattern and a non-round pattern.

27. The method according to claim 1, further comprising supporting a portion of one or more patterns in the template mask wafer exclusively using a semi-transparent layer of the template mask wafer.

28. The method according to claim 27, further comprising selecting the one or more patterns to include at least one of a round donut pattern and a non-round donut pattern.

29. The method according to claim 1, wherein the contact between the template mask wafer and the device wafer results in a single thermally combined body in which thermal energy is distributed.

30. The method according to claim 1, further comprising selecting a material of the semi-transparent layer so that only a negligible amount of beam scatter is caused as the electron beam passes through the semi-transparent layer.

31. The method according to claim 30, wherein the material is selected from the group consisting of amorphous carbon, a diamond film, and a doped Si material.

32. The system according to claim 9, wherein a portion of one or more patterns in the template mask wafer is supported exclusively using a semi-transparent layer of the template mask wafer.

33. The system according to claim 32, wherein the one or more patterns include at least one of a round donut pattern and a non-round donut pattern.

34. The system according to claim 9, wherein the contacting between the template mask wafer and the device wafer facilitates a single thermally combined body in which thermal energy is distributed.

35. The system according to claim 9, wherein a material of the semi-transparent layer is configured to produce only a negligible amount of beam scatter as the electron beam passes through the semi-transparent layer.

36. The method according to claim 35, wherein the material is selected from the group consisting of amorphous carbon, a diamond film, and a doped Si material.

* * * * *

UNITED STATES PATENT AND TRADEMARK OFFICE
CERTIFICATE OF CORRECTION

PATENT NO. : 10,950,441 B1
APPLICATION NO. : 16/811339
DATED : March 16, 2021
INVENTOR(S) : Takao Utsumi It is certified that error appears in the above-identified patent and that said Letters Patent is hereby corrected as shown below:

On the Title Page

Item (73) Please replace the name of the Assignee "Kyoka Utsumi Mimura" with "Kyoko Utsumi Mimura".

Signed and Sealed this
Twenty-fifth Day of October, 2022

Katherine Kelly Vidal
*Director of the United States Patent and Trademark Office*